(12) United States Patent
Yamada

(10) Patent No.: US 8,359,564 B2
(45) Date of Patent: Jan. 22, 2013

(54) CIRCUIT DESIGN INFORMATION GENERATING EQUIPMENT, FUNCTION EXECUTION SYSTEM, AND MEMORY MEDIUM STORING PROGRAM

(75) Inventor: Kazuo Yamada, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 219 days.

(21) Appl. No.: 12/725,908

(22) Filed: Mar. 17, 2010

(65) Prior Publication Data

US 2011/0022995 A1 Jan. 27, 2011

(30) Foreign Application Priority Data

Jul. 21, 2009 (JP) .................. 2009-170480

(51) Int. Cl.
*G06F 17/50* (2006.01)
*G06F 13/36* (2006.01)
*G06F 9/26* (2006.01)

(52) U.S. Cl. ........ 716/117; 716/116; 710/308; 711/209; 711/213

(58) Field of Classification Search .......... 716/116–117; 710/308; 711/202, 209, 213
See application file for complete search history.

(56) References Cited

U.S. PATENT DOCUMENTS

| | | | | |
|---|---|---|---|---|
| 5,603,043 | A * | 2/1997 | Taylor et al. ................... 712/1 |
| 6,336,180 | B1 * | 1/2002 | Long et al. ...................... 712/34 |
| 6,336,209 | B1 * | 1/2002 | Nishihara et al. ............. 716/117 |
| 6,629,310 | B1 * | 9/2003 | Wong-Lam et al. .......... 716/117 |
| 6,862,724 | B1 * | 3/2005 | Riley et al. ..................... 326/39 |
| 6,941,545 | B1 * | 9/2005 | Reese et al. ................... 717/130 |
| 7,024,660 | B2 * | 4/2006 | Andrade et al. ............... 717/124 |
| 7,089,293 | B2 * | 8/2006 | Grosner et al. ................ 709/217 |
| 7,171,632 | B2 * | 1/2007 | Masuda et al. ................. 716/102 |
| 7,206,730 | B2 * | 4/2007 | Pochayevets et al. .......... 703/14 |
| 7,296,008 | B2 * | 11/2007 | Passerini et al. ...................... 1/1 |
| 7,464,360 | B2 * | 12/2008 | Haji-Aghajani et al. ..... 716/102 |
| 7,543,096 | B2 * | 6/2009 | Davies .......................... 710/268 |
| 7,546,394 | B1 * | 6/2009 | Jacobson et al. ................ 710/23 |
| 7,574,536 | B2 * | 8/2009 | Johnsen et al. ................. 710/22 |
| 7,657,724 | B1 * | 2/2010 | DeHaemer ..................... 711/202 |
| 7,779,172 | B2 * | 8/2010 | Sasaki et al. .................... 710/22 |
| 7,840,777 | B2 * | 11/2010 | Mykland ......................... 712/15 |
| 7,906,987 | B2 * | 3/2011 | Marui .............................. 326/38 |
| 7,917,876 | B1 * | 3/2011 | Schumacher et al. ......... 716/116 |
| 8,108,538 | B2 * | 1/2012 | Oved ............................. 709/231 |
| 2002/0070753 | A1 * | 6/2002 | Vogel et al. ..................... 326/37 |

(Continued)

FOREIGN PATENT DOCUMENTS

JP A-2001-243075 9/2001
JP A-2003-36435 2/2003

*Primary Examiner* — Stacy Whitmore
(74) *Attorney, Agent, or Firm* — Oliff & Berridge, PLC

(57) ABSTRACT

A design information generating equipment is provided. A control component of the design information generating equipment, when a basic function of the plurality of functions constitutes a requested function, and design information that corresponds to the basic function is stored in a second memory area, uses the stored design information, and, when the design information that corresponds to the basic function of the plurality of functions is not stored in the second memory area, uses a source program corresponding to the basic function of the plurality of functions stored in a first memory area, and performs control so as to generate design information corresponding to the basic function of the plurality of functions and stores the generated design information in the second memory area, and, using the generated design information, reconfigures a design configured to execute the requested function, and executes the requested function with the reconfigurable design information.

8 Claims, 16 Drawing Sheets

U.S. PATENT DOCUMENTS

| | | | |
|---|---|---|---|
| 2002/0078268 A1* | 6/2002 | Lasserre | 710/22 |
| 2003/0070058 A1* | 4/2003 | Ostrovsky et al. | 711/209 |
| 2003/0101425 A1* | 5/2003 | Makinen | 716/11 |
| 2003/0145304 A1* | 7/2003 | Carter | 716/18 |
| 2004/0111680 A1* | 6/2004 | Lim et al. | 716/1 |
| 2005/0039148 A1* | 2/2005 | Masuda et al. | 716/1 |
| 2005/0283743 A1* | 12/2005 | Mulholland et al. | 716/1 |
| 2006/0010264 A1* | 1/2006 | Rader et al. | 710/23 |
| 2006/0259884 A1* | 11/2006 | Fong et al. | 716/5 |
| 2010/0257298 A1* | 10/2010 | Cummings et al. | 710/301 |
| 2011/0041105 A1* | 2/2011 | Chou et al. | 716/106 |
| 2011/0126164 A1* | 5/2011 | Marui | 716/117 |
| 2011/0213854 A1* | 9/2011 | Haviv | 709/212 |
| 2012/0036301 A1* | 2/2012 | Caspole et al. | 710/308 |

\* cited by examiner

FIG.5
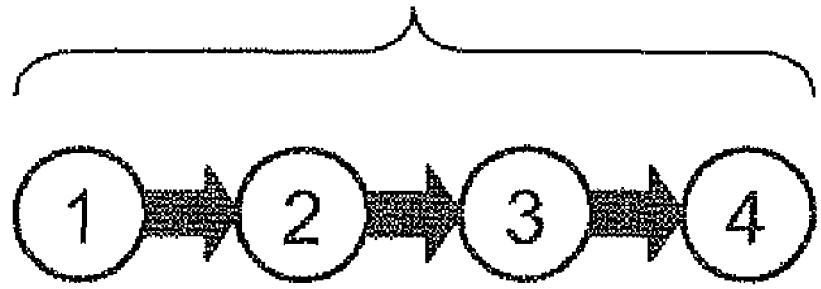
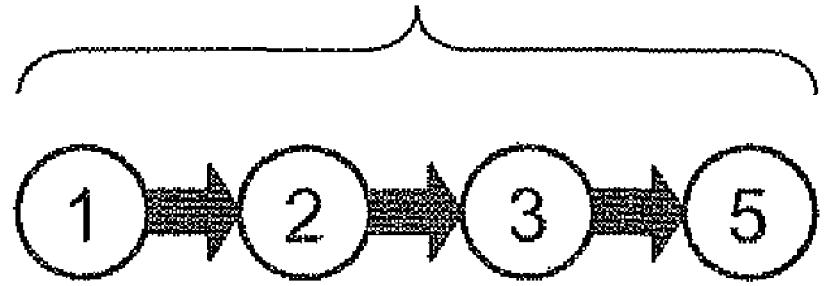

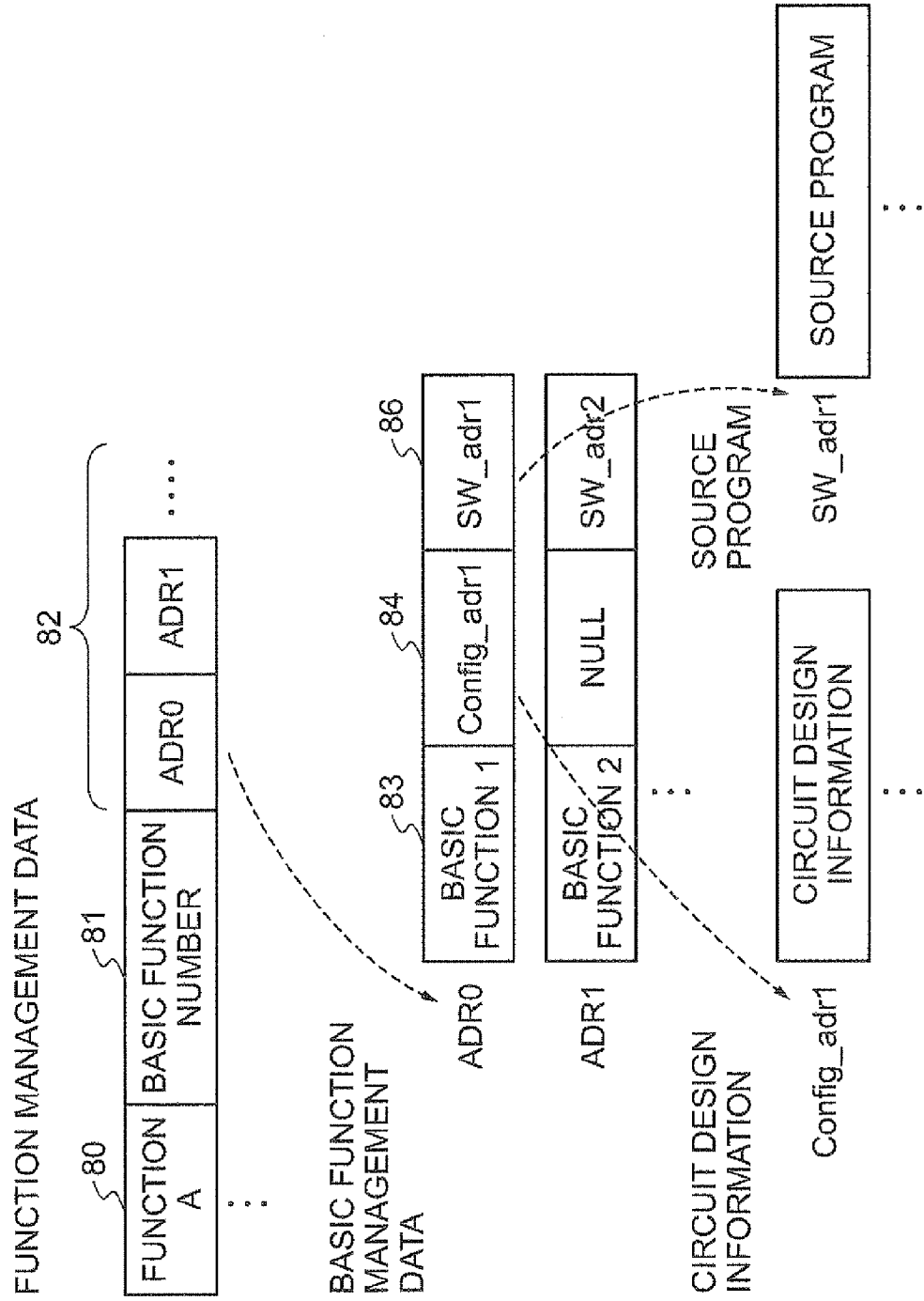

FIG.9

BASIC FUNCTION MANAGEMENT DATA

| | 83 | 84 | 85 | 86 | 87 |
|---|---|---|---|---|---|
| ADR0 | BASIC FUNCTION 1 | Config_adr1 | EXECUTION TIME | SW_adr1 | EXECUTION TIME |
| ADR1 | BASIC FUNCTION 2 | NULL | EXECUTION TIME | SW_adr2 | EXECUTION TIME |

⋮

CIRCUIT DESIGN INFORMATION GENERATING EQUIPMENT, FUNCTION EXECUTION SYSTEM, AND MEMORY MEDIUM STORING PROGRAM

CROSS-REFERENCE TO RELATED APPLICATIONS

This application is based on and claims priority under 35 USC 119 from Japanese Patent Application No. 2009-170480 filed on Jul. 21, 2009.

BACKGROUND

1. Technical Field

The invention relates to a circuit design information generating equipment, a function execution system, and a memory medium storing a program.

2. Related Art

A technology for switching to use an image processing component or use an external server to process image data under a predetermined condition and a technology for causing multi-functional peripherals on a network to download a program stored in a file server and execute processes related to various functions are disclosed.

SUMMARY

According to an aspect of the invention, there is provided a circuit design information generating equipment. The circuit design information generating equipment comprises: a first memory area that stores a source program which corresponds to at least one basic function of a plurality of functions; a second memory area that associates circuit design information used to reconfigure a circuit design information with the basic function and stores the circuit design information; and a control component that, when the basic function of the plurality of functions constitutes a requested function, and circuit design information that corresponds to the basic function is stored in the second memory area, uses the stored circuit design information, and, when the circuit design information that corresponds to the basic function of the plurality of functions is not stored in the second memory area, uses the source program corresponding to the basic function of the plurality of functions stored in the first memory area, and performs control so as to generate circuit design information corresponding to the basic function of the plurality of functions and stores the generated circuit design information in the second memory area, and, using the generated circuit design information, reconfigures a circuit design information configured to execute the requested function, and executes the requested function with the reconfigurable circuit design information.

BRIEF DESCRIPTION OF THE DRAWINGS

Exemplary embodiments of the present invention will be described in detail based on the following figures, wherein:

FIG. 5 is a diagram illustrating relationships between functions and basic functions;

FIG. 6A is a diagram illustrating an example of function management data and basic function management data;

FIG. 9 is a diagram illustrating an example of basic function management data according to the second exemplary embodiment;

DETAILED DESCRIPTION

First Exemplary Embodiment

Figure 1:
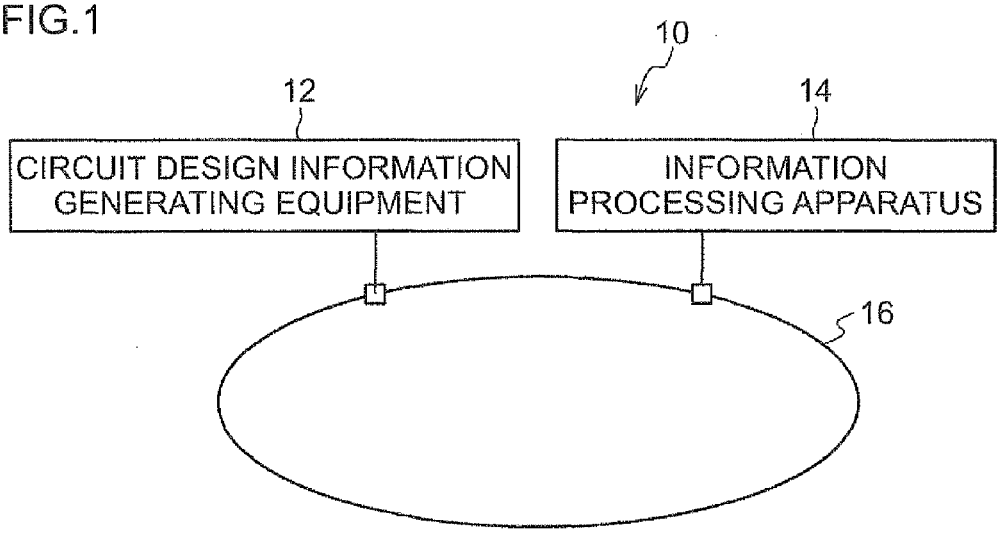
FIG. 1 is a diagram illustrating the schematic configuration of a function execution system according to the first to third exemplary embodiments.

FIG. 1 illustrates the schematic configuration of a function execution system 10 according to the first exemplary embodiment. The function execution system 10 includes a circuit design information generating equipment 12 and an information processing apparatus 14. The circuit design information generating equipment 12 and the information processing apparatus 14 communicate with each other through a network 16.

Figure 2:
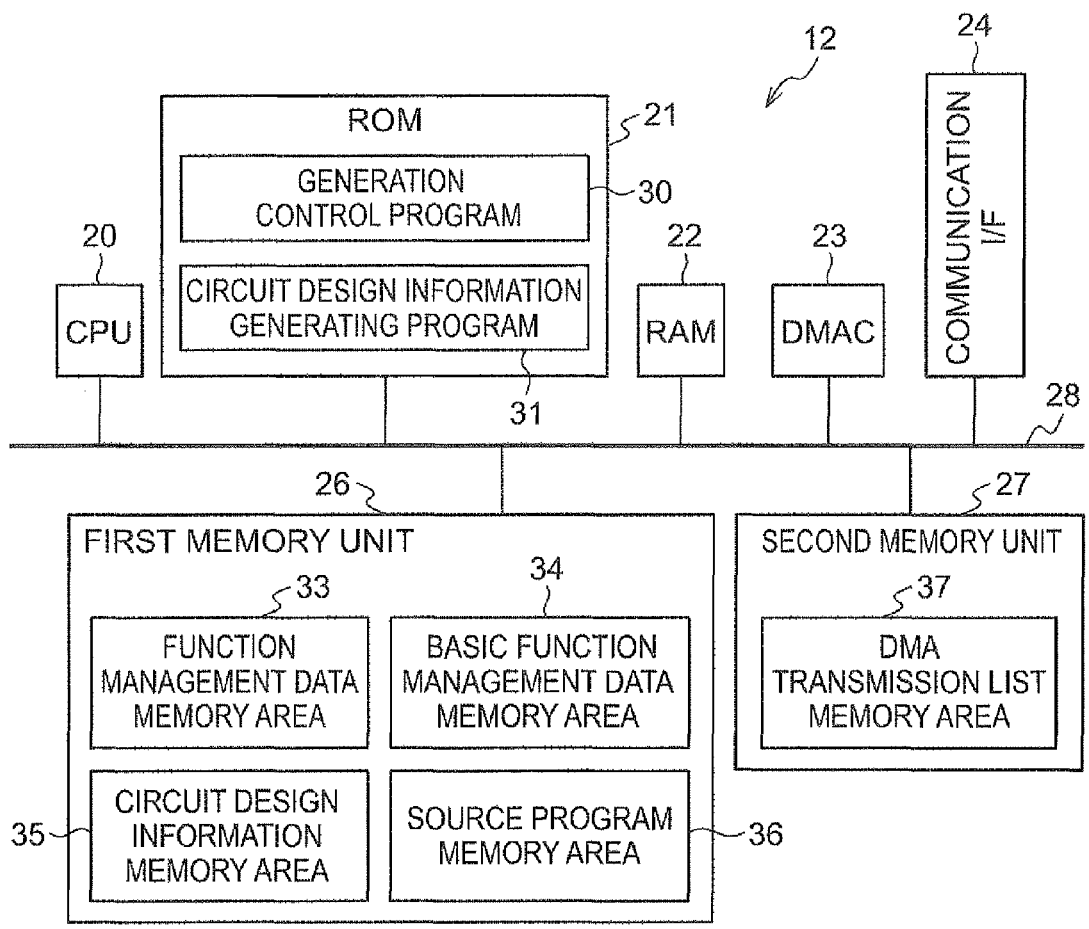
FIG. 2 is a diagram illustrating the schematic configuration of a circuit design information generating equipment according to the first to third exemplary embodiments.

FIG. 2 illustrates the schematic configuration of the circuit design information generating equipment 12. The circuit design information generating equipment 12 includes a central processing unit (CPU) 20, a read only memory (ROM) 21, a random access memory (RAM) 22, a direct memory access (DMA) control circuit 23 (hereinafter, simply referred to as DMAC 23), a communication interface (I/F) 24, a first storage unit 26, and a second storage unit 27. These components are connected to each other through a bus 28.

The CPU 20 executes a program that is stored in the ROM 21. The ROM 21 previously stores a program executed by the CPU 20 or various data needed to execute the program. In the first exemplary embodiment, a generation control program that controls generation of circuit design information used to reconfigure a circuit design information 57 to be described in detail below is stored in a generation control program memory area 30 of the ROM 21, and a circuit design information generation program used to generate circuit design information is stored in a circuit design information generation program memory area 31.

The RAM 22 is used as a memory that temporarily stores data received from other apparatuses through the communication I/F 24 or newly generated data and used as a work memory when the CPU 20 executes the program.

A memory medium that stores the program executed by the CPU 20 is not limited to the ROM 21. For example, although not illustrated in the drawings, the memory medium may be a portable recording medium, such as a CD-ROM, a DVD disk, a magneto-optical disk, and an IC card, or a storage device, such as an HDD, which is included inside or outside the circuit design information generating equipment 12. Alternatively, the memory medium may be a database connected through the network 16, another computer system and a database thereof, or a transmission medium like a carrier wave on a telecommunication line.

The DMAC 23 transmits data without using the CPU 20 (DMA transmission). Specifically, the DMAC 23 reads circuit design information from a circuit design information memory area 35 of the first storage unit 26, based on a DMA transmission list stored in a DMA transmission list memory area 37 of the second storage unit 27 to be described in detail below, and transmits the circuit design information to the information processing apparatus 14 through the communication I/F 24. The DMA transmission list is a list where the transmission information used at the time of the DMA transmission is registered in transmission order. The transmission information includes a transmission origin address, a transmission destination address (in this case, address of the information processing apparatus 14), and a transmission size of data transmitted through the DMA transmission.

The first storage unit 26 has a function management data memory area 33 that stores function management data, a basic function management data memory area 34 that stores basic function management data, a circuit design information memory area 35 that stores the generated circuit design information, and a source program memory area 36 that stores a source code (also called source program) of a program to execute a basic function using the CPU.

The function management data is data that is used to manage a function executable at a function executing unit 44 of the information processing apparatus 14 to be described in detail below. Here, "functions" and "basic functions" in the first exemplary embodiment will be described. Each of the functions that are executed by the function executing unit 44 is composed of one or more basic functions. For example, a function that is executed by the function executing unit 44 to generate the image data when plural pages are collectively recorded on one page of paper are composed of basic functions such as an image reducing process, an image rotating process, and a halftone process.

The functions and the basic functions will be further described. FIG. 5 illustrates the schematic configuration of a function A and a function B that are different from each other. The function A is realized by sequentially executing four basic functions of a basic function 1, a basic function 2, a basic function 3, and a basic function 4. The function B is realized by sequentially executing four basic functions of the basic function 1, the basic function 2, the basic function 3, and a basic function 5. As such, the common basic functions may be included in the different functions. In the first exemplary embodiment, by the function management data, the basic functions that are included in each function are specified, and the execution order of each basic function is defined.

At an upper part of FIG. 6A, an example of the function management data is illustrated. In this example, each function management data includes identification information 80 that is used to identify each function, a basic function number 81 that indicates the number of basic functions constituting each function, and an address 82 that indicates a memory area of basic function management data for each of the basic functions constituting each function (hereinafter, referred to as management data address 82). The management data addresses 82 are arranged in the execution order of the basic functions.

The basic function management data is data that is used to manage each of the basic functions constituting each function. Each basic function management data is stored in each memory area that is indicated by the management data address 82 of the function management data. At a middle part of FIG. 6A, an example of the basic function management data is illustrated. In this example, each basic function management data includes identification information 83 that is used to identify each basic function, an address 84 that indicates a memory area of circuit design information corresponding to each basic function (hereinafter, referred to as circuit design information address 84), and an address 86 that indicates a memory area of a source program corresponding to each basic function (hereinafter, referred to as program address 86).

The circuit design information is dynamically generated based on the corresponding source program for each basic function, if necessary. However, at a stage before the generation of the circuit design information, a NULL value is set to the circuit design information address 84. When the circuit design information is generated and stored in the circuit design information memory area 35 as illustrated at a lower part of FIG. 6A, the address that indicates the stored area is set to the circuit design information address 84.

The source program is previously stored in the source program memory area 36, not like the circuit design information. Accordingly, in the program address 86, an address value that indicates the memory area where the source program is stored is previously set.

Figure 6B:
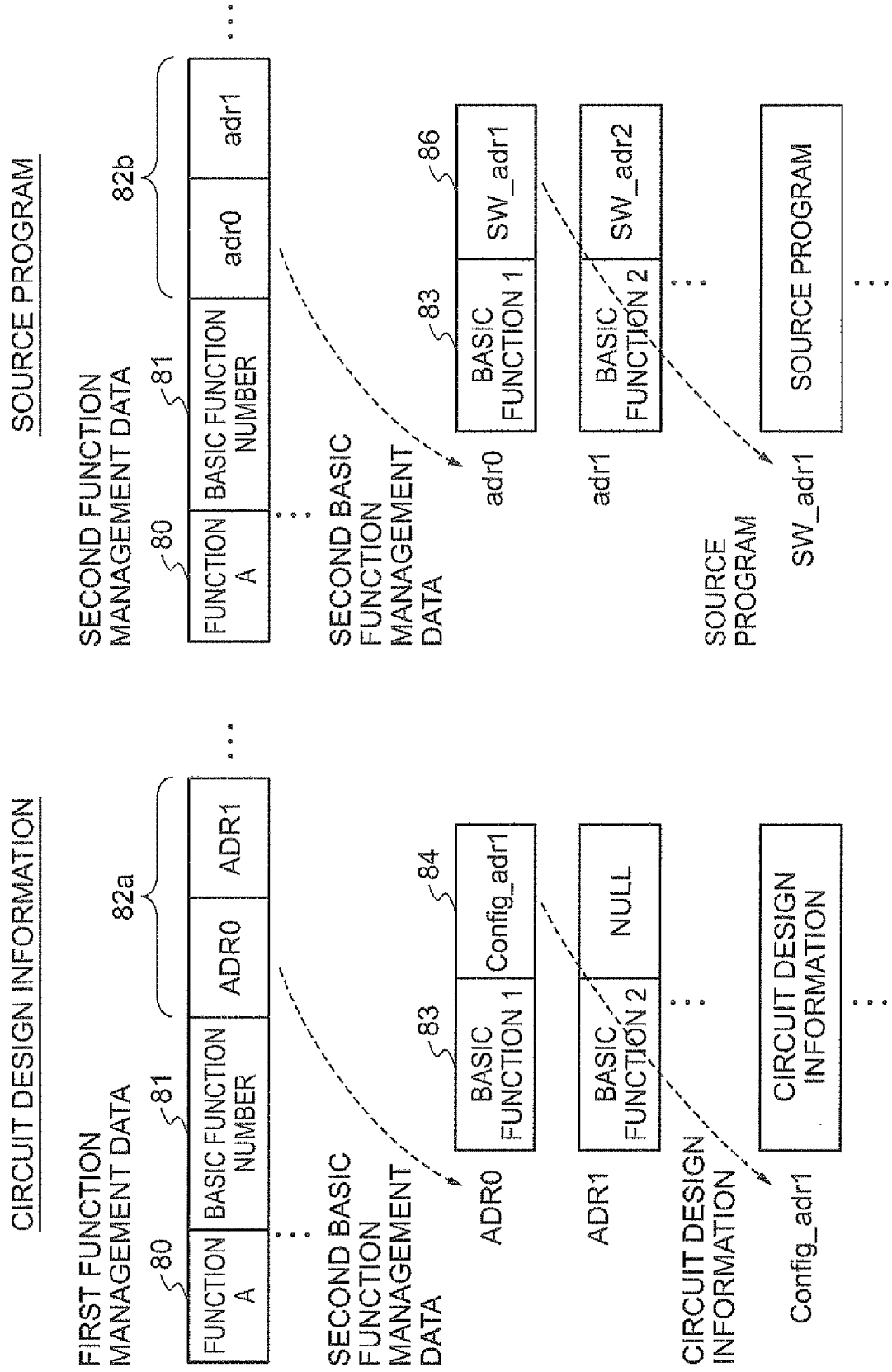
FIG. 6B is a diagram illustrating another example of function management data and basic function management data.

The method that manages the circuit design information and the source programs is not limited to the above example. For example, as illustrated in FIG. 6B, independently and respectively from each of the circuit design information and the source programs, the function management data and the basic function management data may be stored and managed.

However, in the first exemplary embodiment, it is assumed that the data management illustrated in FIG. 6A is performed.

The second storage unit 27 includes a DMA transmission list memory area 37 which stores a DAM transmission list that is used when the DMAC 23 performs the DMA transmission.

Each of the first storage unit 26 and the second storage unit 27 may be composed of a hard disk drive (HDD) or a memory element where rewrite is enabled, such as an electrically erasable and programmable read only memory (EEPROM). The program that is executed by the CPU 20 may be stored in the first storage unit 26 or the second storage unit 27. Each of the first storage unit 26 and the second storage unit 27 may be an external storage device.

In the first exemplary embodiment, the case where the function management data memory area 33, the basic function management data memory area 34, the circuit design information memory area 35, and the source program memory area 36 are provided in the first storage unit 26 and the DMA transmission list memory area 37 is provided in the second storage unit 27 is exemplified, but the places of the individual memory areas are not limited thereto. For example, the DMA transmission list memory area 37 may be provided in the first storage unit 26, and the function management data memory area 33, the basic function management data memory area 34, the circuit design information memory area 35, and the source program memory area 36 may be provided in the second storage unit 27. Alternatively, the function management data memory area 33, the basic function management data memory area 34, the rotation information memory area 35, and the source program memory area 36 may be provided in the different storage media, respectively.

The communication I/F 24 is connected to the network 16. The circuit design information generating equipment 12 exchanges information with the information processing apparatus 14 connected to the network 16 through the communication I/F 24.

Figure 3:
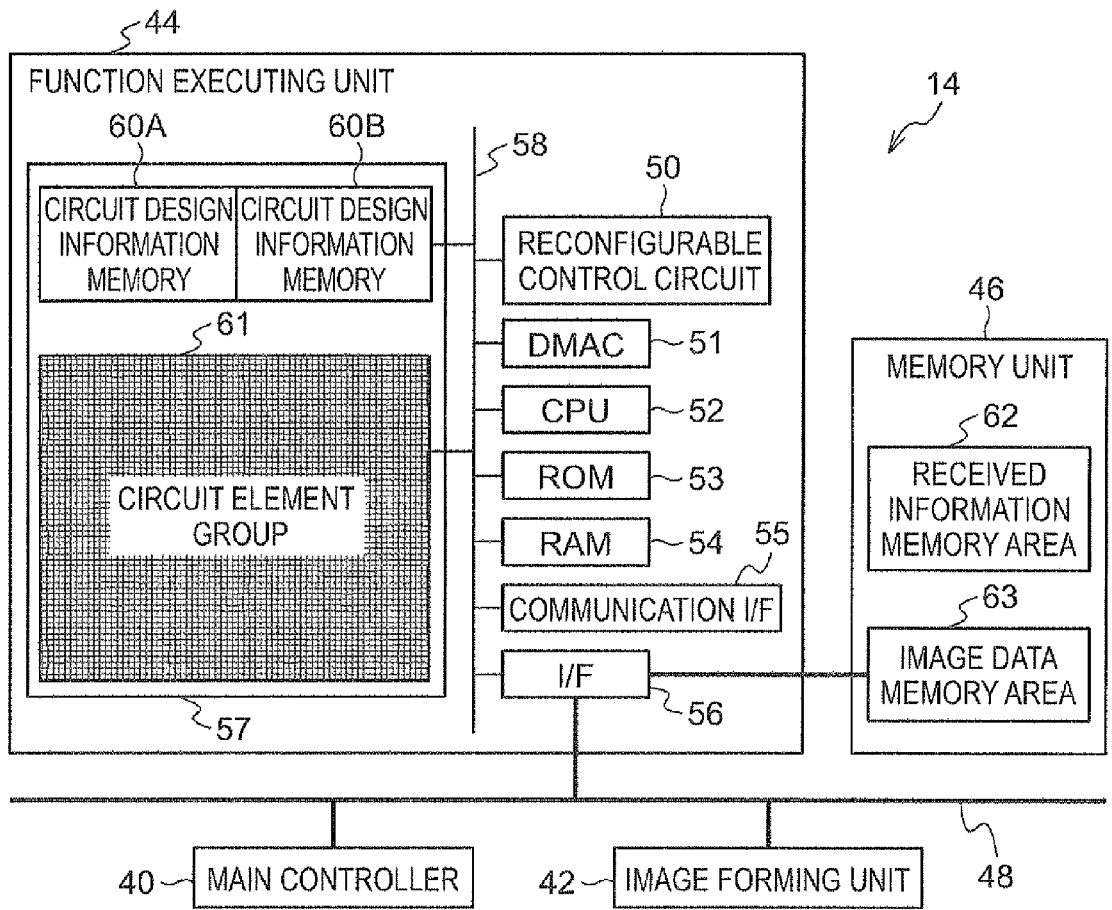
FIG. 3 is a diagram illustrating the schematic configuration of an information processing apparatus according to the first to third exemplary embodiments.

FIG. 3 illustrates the schematic configuration of the information processing apparatus 14. In the first exemplary embodiment, the apparatus that processes the image and forms the image is exemplified as the information processing apparatus 14, but the invention is not limited thereto.

The information processing apparatus 14 includes a main controller 40 that controls the whole operation of the information processing apparatus 14, an image forming unit 42 that forms an image based on the given image data, a function executing unit 44 that executes image processing on image data by executing various functions, and a storage unit 46. These components are connected to each other through a bus 48.

The function executing unit 44 includes a reconfigurable control circuit 50, a DMA control circuit 51 (hereinafter, referred to as DMAC 51), a central processing unit (CPU) 52, a read only memory (ROM) 53, a random access memory (RAM) 54, a communication I/F 55, an I/F 56, and a circuit 57. These components are connected to each other through a bus 58. The function executing unit 44 is connected to the storage unit 46 through the I/F 56. The I/F 56 is connected to the bus 48.

The circuit 57 is a circuit design information that is reconfigurable based on the circuit design information. The circuit 57 includes circuit design information memories 60A and 60B to store circuit design information, and a circuit element group 61 that is configured to include logic cells, logic cells, and input/output terminals.

Each of the circuit design information memories 60A and 60B is composed of a memory element where rewrite is enabled, such as an electrically erasable and programmable read only memory (EEPROM) or a static random access memory (SRAM). The circuit element group 61 is connected by either one of the circuit design information memories 60A and 60B. The circuit design information includes information of a connection relationship between the logic cells or information of input/output setting. Based on the circuit design information that is developed in the circuit design information memory 60A or the circuit design information memory 60B connected to the circuit element group 61, the circuit design information configuration in the logic cells of the circuit element group 61 or a connection state of the logic cells where the logical cells and the input/output terminals are connected to each other is reconfigurable.

The reconfigurable control circuit 50 reconfigures the circuit 57 using the circuit design information. Specifically, the reconfigurable control circuit 50 reads the circuit design information from the storage unit 46 through the I/F 56 and develops the circuit design information in the circuit design information memories 60A and 60B, thereby performing the reconfiguration. At this time, the reconfigurable control circuit 50 executes bank switching to switch the circuit design information memories 60A and 60B connected to the circuit element group 61 at appropriate timing, thereby realizing the circuit design information configuration where the necessary functions are sequentially executed on the circuit element group 61 (reconfiguration process).

The DMAC 51 performs the DMA transmission with the DMAC 23 of the circuit design information generating equipment 12 without using the CPU 52. Specifically, the DMAC 51 sequentially transmits the circuit design information, which is received from the circuit design information generating equipment 12 through the communication I/F 55, to the storage unit 46 to be stored.

The CPU 52 executes the program that is stored in the ROM 53 and executes various processes (for example, function executing process to be described in detail below). The RAM 54 is used as a work memory.

In the first exemplary embodiment, the memory medium where the program executed by the CPU 52 is stored is not limited to the ROM 53, and may be, for example, the storage unit 46.

The communication I/F 55 is an interface that is used to communicate with an external apparatus through the network 16.

The function executing unit 44 is connected to the storage unit 46 through the I/F 56. The storage unit 46 includes a received information memory area 62 that stores information (circuit design information in the first exemplary embodiment) received from the circuit design information generating equipment 12, and an image data memory area 63 that temporarily buffers the image data processed by the function executing unit 44. In the first exemplary embodiment, in the received information memory area 62, each circuit design information that corresponds to each basic function received from the circuit design information generating equipment 12 is stored and managed respectively. Therefore, even when the plural functions have the common basic functions, the circuit design information corresponding to the common basic functions is respectively stored for each of the functions.

The storage unit 46 may be a memory element where rewrite is enabled, such as an EEPROM or an SDRAM, or may be an HDD. That is, the storage unit 46 is not limited in particular.

The image forming unit 42 may be an image forming unit of an electro photographic system or an image forming unit of an inkjet system. That is, the image forming unit 42 is not limited in particular.

Next, the configuration of the main controller 40 will be described with reference to FIG. 4.

Figure 4:
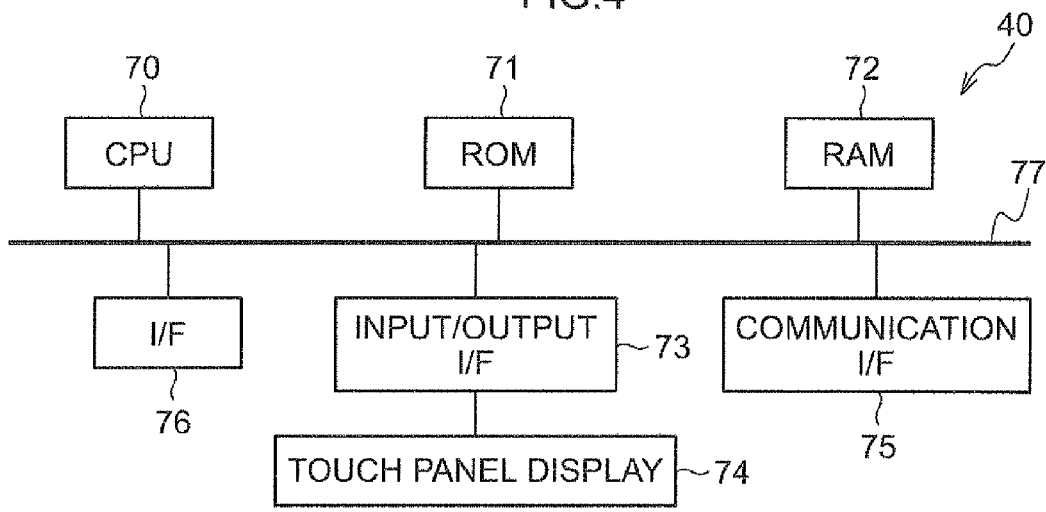
FIG. 4 is a diagram illustrating the schematic configuration of a main controller according to the first to third exemplary embodiments.

FIG. 4 illustrates the schematic configuration of the main controller 40. The main controller 40 includes a central processing unit (CPU) 70, a read only memory (ROM) 71, a random access memory (RAM) 72, an input/output interface (I/F) 73, a communication I/F 75, and an I/F 76. These components are connected to each other through a bus 77. The I/F 76 is also connected to the bus 48.

The CPU 70 executes the program that is stored in the ROM 71. The ROM 71 previously stores a program executed by the CPU 70 or various data needed to execute the program. In the first exemplary embodiment, an apparatus management program that is executed by the CPU 70 is stored in the ROM 71. By executing the apparatus management program the main controller 40 manages and controls the entire information processing apparatus 14.

The RAM 72 is used as a frame memory that temporarily stores various data, such as image data received from other apparatuses through the communication I/F 75 or newly generated image data, and also used as a work memory when the CPU 70 executes the program.

The memory medium that stores the program executed by the CPU 70 is not limited to the ROM 71. For example, although not illustrated in the drawings, the memory medium may be a portable memory medium, such as a CD-ROM, a DVD disk, a magneto-optical disk, and an IC card, or a storage device, such as an HDD, which is included inside or outside the information processing apparatus 14. Alternatively, the memory medium may be a database connected through the network 16, another computer system and a database thereof, or a transmission medium like a carrier wave on a telecommunication line.

The input/output IF 73 is connected to a touch panel display 74 that serves as a user interface where a touch panel is overlaid to a display panel composed of a liquid crystal display panel. The touch panel display 74 has a function as a display unit that displays information, such as an image or various messages, according to a control signal from the CPU 70, and a function as an instruction unit that instructs and inputs execution requests of various functions or setting information by designating an arbitrary position on the displayed image by a user. Alternatively, instead of the touch panel display, a display unit, such as a liquid crystal display, and an instruction unit, such as operation buttons operated by an operator, may be individually provided.

The communication I/F 75 is an interface that is used to communicate with an external apparatus through the network 16. The main controller 40 may receive execution requests of various functions through the network 16.

In the first exemplary embodiment, the main controller 40 receives the execution requests of the functions through the touch panel display 74 or the communication I/F 75, as described above. However, the main controller 40 transmits the execution request of the function to be executed by the function executing unit 44 among the received execution requests to the function executing unit 44.

Next, the function of the first exemplary embodiment will be described.

Figure 7:
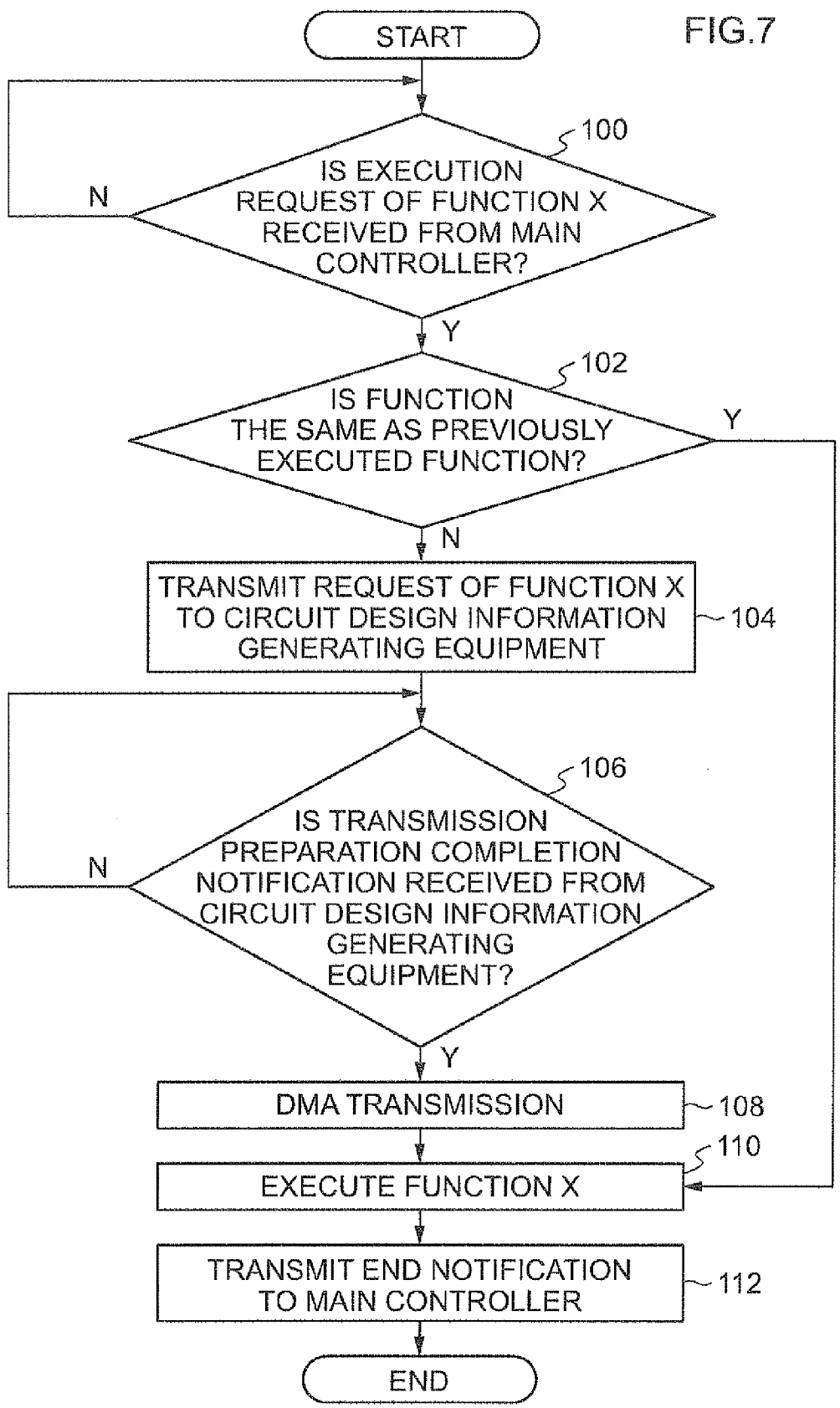
FIG. 7 is a flowchart illustrating a flow of a function executing process that is executed by a CPU of a function executing unit of the information processing apparatus according to the first and second exemplary embodiments.
Figure 8:
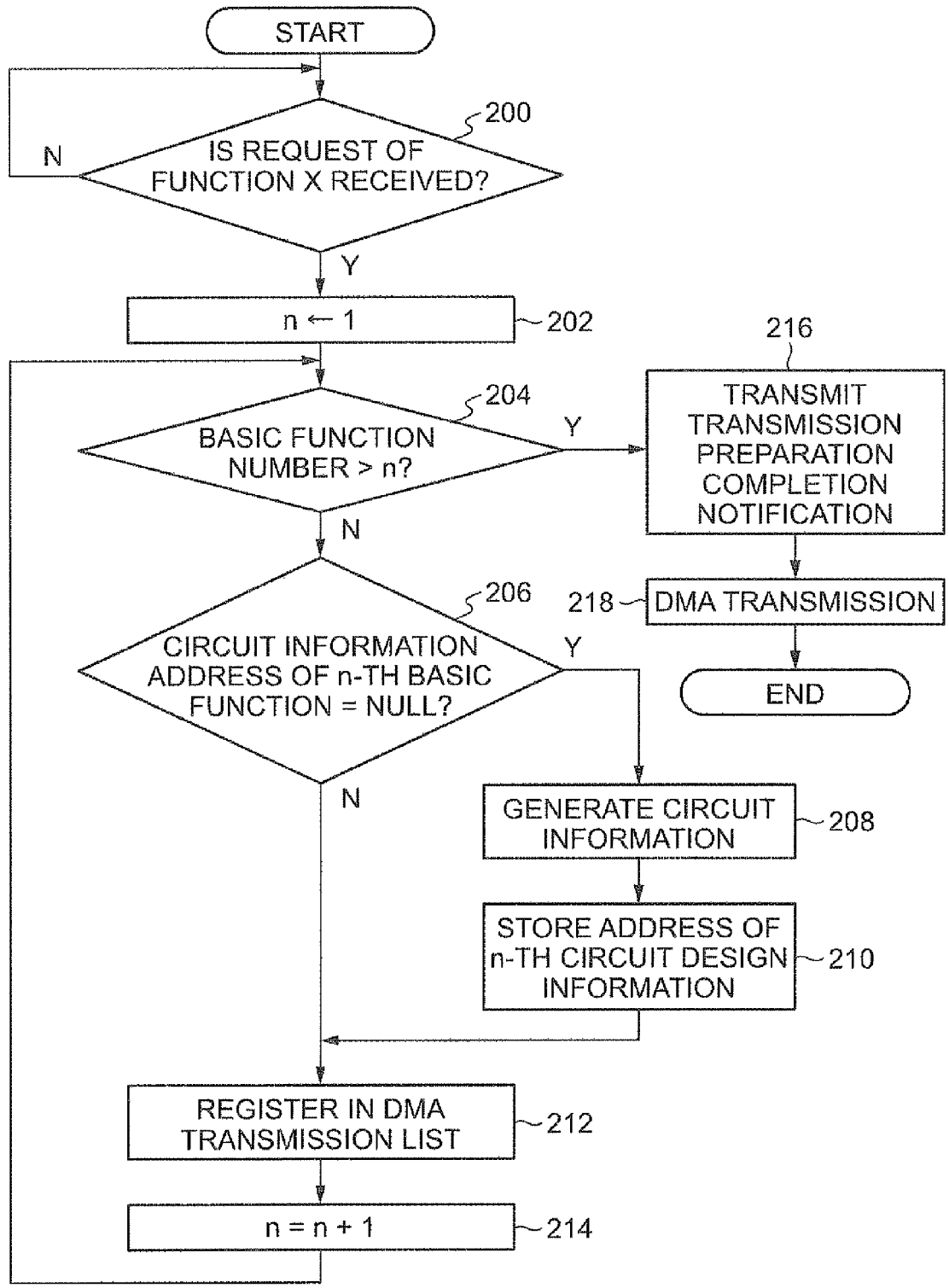
FIG. 8 is a flowchart illustrating a flow of a generation control process that is executed by a CPU of the circuit design information generating equipment according to the first exemplary embodiment.

FIG. 7 is a flowchart illustrating a flow of a function executing process that is executed by the CPU 52 of the function executing unit 44 of the information processing apparatus 14. FIG. 8 is a flowchart illustrating a flow of a generation control process that is executed by the CPU 20 of the circuit design information generating equipment 12.

First, the function executing process in the information processing apparatus 14 will be described. In step 100 of FIG. 7, a waiting state is maintained until an execution request of a function X (X is identification information to identify a function) is received from the main controller 40. In step 100, when the execution request of the function X is received from the main controller 40, the process proceeds to step 102.

In step 102, it is determined whether the function X is the same as the previously executed function. Specifically, it is confirmed whether circuit design information of the function X is stored in the received information memory area 62 of the storage unit 46. When it is confirmed that the circuit design information is stored, it is determined that the function X is the same as the previously executed function. When it is confirmed that the circuit design information is not stored, it is determined that the function X is different from the previously executed function. In this case, when it is determined that the function X is not the previously executed function, the circuit design information generating equipment 12 is requested to transmit the circuit design information of the function X through the communication I/F 55, in step 104.

In step 106, a waiting state is maintained until a transmission preparation completion notification is received from the circuit design information generating equipment 12. When the transmission preparation completion notification is received, the DMAC 51 starts in step 108. The started DMAC 51 transmits the circuit design information received from the circuit design information generating equipment 12 to the received information memory area 62 of the storage unit 46 through the communication I/F 55, and stores the circuit design information in the received information memory area 62.

In step 110, the function X is executed. Specifically, the reconfigurable control circuit 50 starts by designating the memory area of the circuit design information of the function X. The started reconfigurable control circuit 50 reads the circuit design information used to execute the individual basic functions constituting the function X from the received information memory area 62 of the storage unit 46 in the execution order of the basic functions, and alternately develops the circuit design information in the circuit design information memory 60A and the circuit design information memory 6013. In addition, as described above, the reconfigurable control circuit 50 performs the bank switching and switches the basic functions realized on the circuit element group 61 in the predetermined execution order. As a result, when the function X where the execution is requested is the function A illustrated in FIG. 5, the circuit 57 is reconfigurable in the order of the basic function 1, the basic function 2, the basic function 3, and the basic function 4, and the individual basic functions are executed.

In step 112, an end notification indicating that the execution of the function X ends is transmitted to the main controller 40.

Meanwhile, in step 102, when it is determined that the function is the previously executed function, the circuit 57 may be reconfigurable using the stored circuit design information, because the circuit design information used to realize the function X is already stored in the received information memory area 62 of the storage unit 46. Therefore, the process proceeds to step 110 and the circuit design information is reconfigurable and the function X is executed, similar to the above case.

Next, the generation control process in the circuit design information generating equipment 12 will be described. In step 200 of FIG. 8, the waiting state is maintained until a request of the circuit design information of the function X is received from the information processing apparatus 14. In step 200, when the request of the circuit design information of the function X is received from the information processing apparatus 14, 1 is set to a variable n in step 202.

In step 204, the function management data of the required function X is read and acquired from the first storage unit 26, and it is determined whether n is more than the basic function number stored in the function management data. When it is determined that n is the basic function number or less, in step 206, basic function management data that is stored in a memory area indicated by the management data address 82 corresponding to the nth executed basic function in the function management data of the function X is read and acquired, and it is determined whether a NULL is set to the circuit design information address 84 of the basic function management data. When it is determined that a NULL is set to the circuit design information address 84, the process proceeds to step 208, because the circuit design information of the basic function is not yet generated.

In step 208, a circuit design information generating program is started and executed, and circuit design information is generated. Specifically, a source program corresponding to the n-th basic function is read from a memory area that is indicated by the program address 86 in the read and acquired basic function management data, circuit design information used to realize the n-th basic function on the circuit 57 is generated based on the read source program, and the circuit design information is stored in an empty space of the circuit design information memory area 35.

In step 210, the address value that indicates the memory area storing the circuit design information of the basic function is registered as the circuit design information address 84 of the basic function management data that corresponds to the basic function. Thereby, the NULL is changed to the address value of the memory area storing the circuit design information.

After step 210, the process proceeds to step 212, and the n-th transmission information is registered in the DMA transmission list, such that the circuit design information of the n-th executed basic function is transmitted to the information processing apparatus 14. Specifically, a value (transmission origin address) of the circuit design information address 84, a data size (transmission size) of the circuit design information, and an address (transmission destination address) of the information processing apparatus 14 are registered in the DMA transmission list.

In step 214, 1 is added to n and the process returns to step 204.

Meanwhile, in step 206, when it is determined that the NULL is not set to the circuit design information address 84 of the basic function management data that is stored in the memory area indicated by the management data address 82 corresponding to the n-th executed basic function in the function management data of the function X, the circuit design information is already generated. Therefore, steps 208 and 210 are skipped and the process proceeds to step 212. In step 212, the value (transmission origin address) of the circuit design information address 84, the data size (transmission size) of the circuit design information, and the address (transmission destination address) of the information processing apparatus 14 are registered as the n-th transmission information in the DMA transmission list. In step 214, 1 is added to n and the process returns to step 204.

In step 204, when it is determined that n is more than the basic function number stored in the function management data of the function X, the process proceeds to step 216.

In step 216, a transmission preparation completion notification is transmitted to the information processing apparatus 14. In step 218, the DMAC 23 starts to perform DMA transmission according to the DMA transmission list. The started DMAC 23 transmits the circuit design information of the function X to the information according apparatus 14 according to the DMA transmission list.

A specific example will be described. In the information processing apparatus 14, when the execution of the function B is requested after the function A illustrated in FIG. 5, the basic functions 1 to 3 that are common to the basic functions of the function A among the basic functions constituting the function B are already generated. In this case, with respect to the first to third basic functions, instead of the NULL, the address value is already set to the corresponding circuit design information address 84. Thus, the determination result of step 206 is affirmative, and the circuit design information is not generated. Accordingly, with respect to the function B, only the circuit design information of the fourth executed basic function 5 may be generated.

In the first exemplary embodiment, the function executing unit 44 determines whether the requested function is the previously executed function. When it is determined that the requested function is not the previously executed function, the circuit design information of all of the basic functions constituting the function is requested, and the circuit design information generating equipment 12 transmits the circuit design information of all of the basic functions constituting the function to the information processing apparatus 14. However, the invention is not limited thereto.

For example, the circuit design information generating equipment 12 may store a transmission history of the circuit design information and transmit the circuit design information other than the transmitted circuit design information to the information processing apparatus 14 based on the transmission history, instead of transmitting the circuit design information of all of the basic functions constituting the function to the information processing apparatus 14, such that the previously transmitted circuit design information is not transmitted again. Also for example, the function executing unit 44 may determine whether each of the basic functions constituting the requested function are the previously executed basic function (whether the circuit design information is already stored in the storage unit 46), such that the circuit design information is requested with respect to the circuit design information generating equipment 12 in unit of a basic function, not unit of a function. The circuit design information generating equipment 12 may generate only the circuit design information of the requested basic function and transmit the circuit design information to the information processing apparatus 14.

As such, when the circuit design information is transmitted from the circuit design information generating equipment 12 to the information processing apparatus 14 in unit of the basic function not unit of the function, the circuit design information is stored and managed in the storage unit 46 of the information processing apparatus 14 for each basic function, and the same circuit design information is not redundantly stored. In this case, the information indicating the basic functions constituting each function and the execution order needs to be held by the function executing unit 44. This information may be transmitted from the circuit design information generating equipment 12 to the information processing apparatus 14. The function executing unit 44 sequentially reconfigures the circuit design information and executes the requested function, based on the information indicating the basic functions constituting each function and the execution order that is held in the function executing unit 44 or received from the circuit design information generating equipment 12.

In the first exemplary embodiment, the circuit design information is transmitted through the DMA transmission by the DMAC 23 of the circuit design information generating equipment 12 and the DMAC 51 of the information processing apparatus 14. However, the circuit design information may be transmitted and received through the CPU 20 of the circuit design information generating equipment 12 and the CPU 52 of the information processing apparatus 14.

In the first exemplary embodiment, the circuit design information is generated by the circuit design information generating equipment 12 according to the necessity and is transmitted to the information processing apparatus 14. However, the generation control process in the circuit design information generating equipment 12 may be executed by the main controller 40. That is, the main controller 40 may have the various data that is stored in the first storage unit 26, execute the circuit design information generating program and the generation control processing program to generate the circuit design information of the requested function according to the necessity, and to supply the circuit design information to the function executing unit 44.

Second Exemplary Embodiment

In the second exemplary embodiment, the specific basic function that is executed using a program obtained by converting a format of a source program into an executable format, instead of the circuit 57, is determined from the basic functions constituting the requested function. In regards to the specific basic function, instead of the circuit design information, the source program is transmitted to the information processing apparatus 14.

The configuration of the circuit design information generating equipment 12 according to the second exemplary embodiment is the same as that of the circuit design information generating equipment according to the first exemplary embodiment, except for the configuration of the basic function management data stored in the basic function management data memory area 34 of the first storage unit 26 as illustrated in FIG. 9.

The basic function management data according to the second exemplary embodiment includes an execution time 85 (hereinafter, referred to as HW execution time 85) needed when the basic function is executed using the circuit 57 and an execution time 87 (hereinafter, referred to as SW execution time 87) needed when the basic function is executed using the program obtained by converting the format of the source program into the executable format, in addition to the identification information 83 to identify the basic function, the circuit design information address 84, and the program address 86.

The configuration of the information processing apparatus 14 according to the second exemplary embodiment is the same as that of the information processing apparatus according to the first exemplary embodiment. However, in the received information memory area 62 of the storage unit 46, the source program as well as the circuit design information is received and stored in some cases. The CPU 52 of the function executing unit 44 converts the source program received from the circuit design information generating equipment 12 into the program of the executable format, and executes the converted program to perform the basic function. The program that is needed to convert the source program into the program of the executable format is previously stored in the ROM 53.

Even in the second exemplary embodiment, in the received information memory area 62, the circuit design information and the source program received from the circuit design information generating equipment 12 are stored and managed for each function. Accordingly, even when the plural functions have the common basic functions, the source program or the circuit design information corresponding to the common basic functions is stored separately for each of the plural functions.

Figure 10:
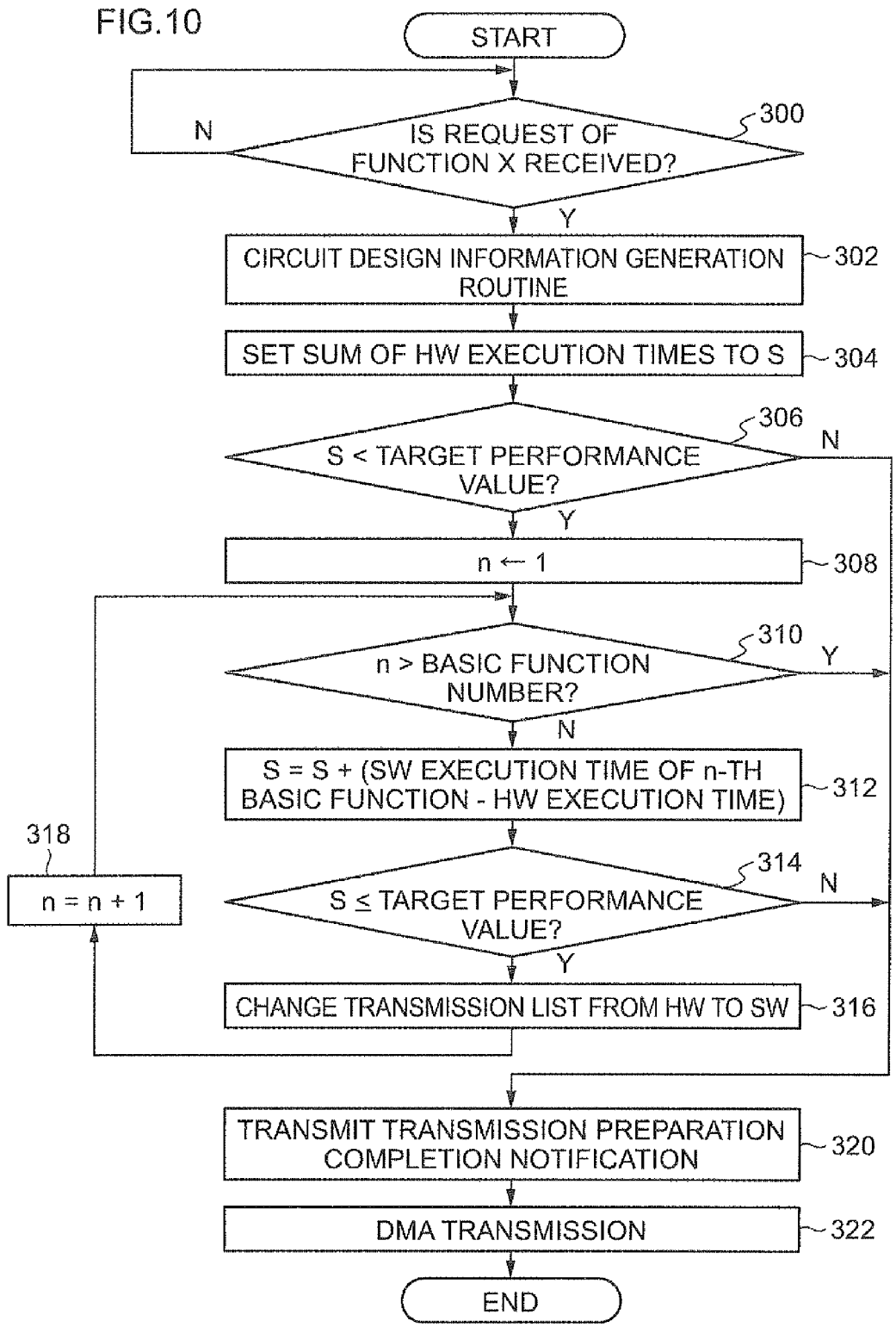
FIG. 10 is a flowchart illustrating a flow of a generation control process that is executed by a CPU of the circuit design information generating equipment according to the second exemplary embodiment.

FIG. 10 is a flowchart illustrating a flow of a generation control process that is executed by the CPU 20 of the circuit design information generating equipment 12 according to the second exemplary embodiment. In this case, it is assumed that the HW execution time 85 is not more than the SW execution time 87 in each basic function.

In step 300, the waiting state is maintained until the request of the circuit design information of the function X is received from the information processing apparatus 14. When the request of the circuit design information of the function X is received from the circuit design information generating equipment 12 in step 300, the circuit design information generation routine is executed and the circuit design information of each basic function is generated according to the necessity in step 302.

Figure 11:
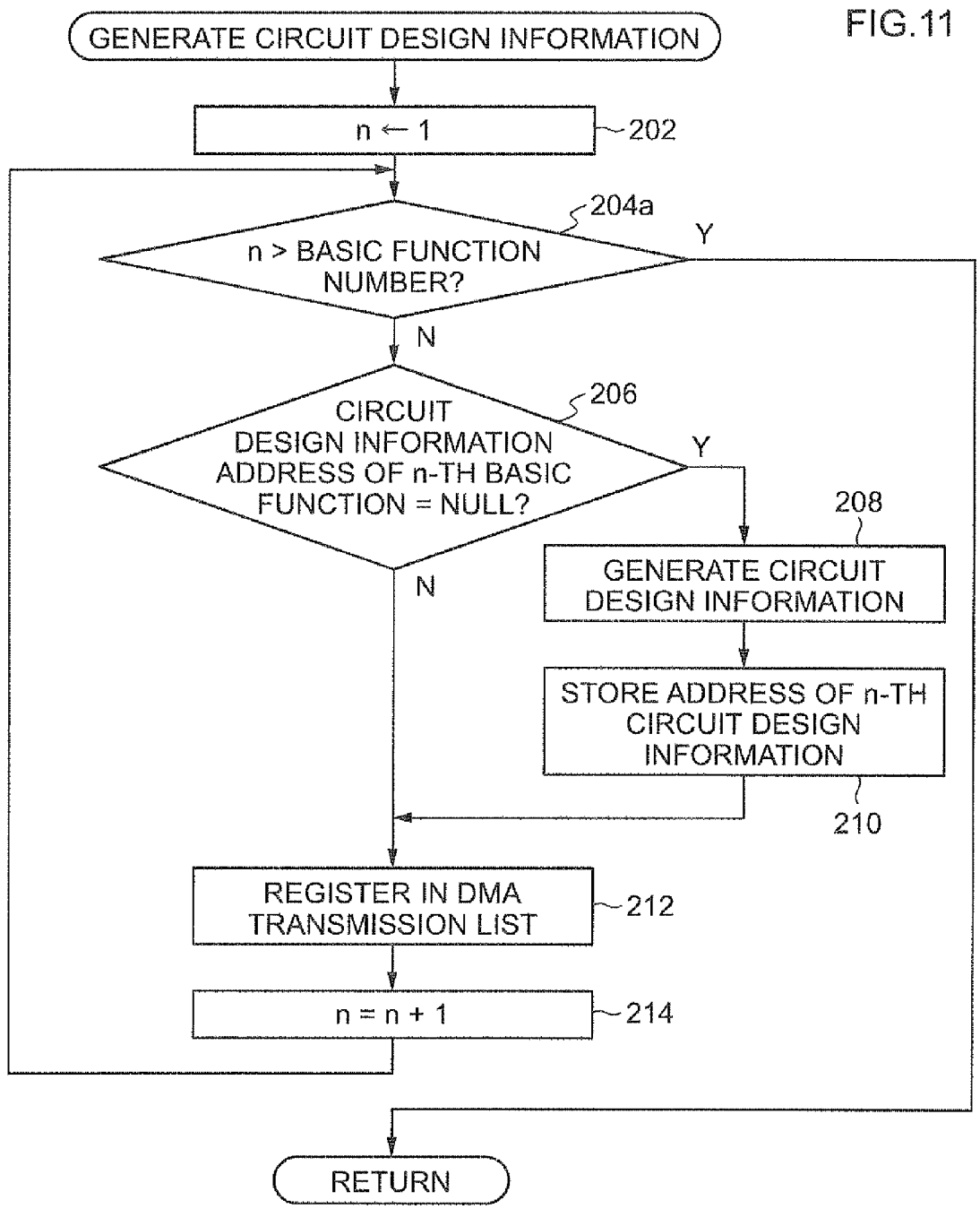
FIG. 11 is a flowchart illustrating a flow of a circuit design information generation routine executed in step 302 of FIG. 10.

FIG. 11 is a flowchart illustrating a flow of the circuit design information generation routine executed in step 302. In FIG. 11, the same steps as those of FIG. 8 are denoted by the same reference numerals, and only different steps are described herein.

In step 204*a*, the function management data of the requested function X is read and acquired from the first storage unit 26, and it is determined whether n is more than the basic function number stored in the function management data. When it is determined that n is not more than the basic function number, the process proceeds to step 206. When n is more than the basic function number, this process routine ends. That is, in the circuit design information generation routine of FIG. 11, the processes of steps 216 and 218 of FIG. 8 are not executed.

After the circuit design information generation routine of step 302 ends, the process proceeds to step 304.

In step 304, the basic function management data of each basic function of the function management data of the function X is read and acquired. Based on the basic function management data, the sum of the HW execution times for the individual basic functions of the function X is calculated and set to a variable S.

In step 306, it is determined whether S is less than a predetermined target performance value. Here, the target performance value is a target value of the execution time of the function X. The target performance value may be previously set for each function or designated by a user using the touch panel display 74 of the main controller 40, and the designated target performance value may be transmitted from the information processing apparatus 14 to the circuit design information generating equipment 12, when the circuit design information of the function X is requested. When it is determined that S is less than the target performance value, the process proceeds to step 308.

In step 308, 1 is set to a variable n.

In step 310, it is determined where n is more than the basic function number stored in the function management data of the function X. When it is determined that n is not more than the basic function number, in step 312, the basic function management data that is stored in the memory area indicated by the management data address 82 corresponding to the n-th basic function of the function management data of the function X is read and acquired, and a value that is obtained by subtracting the HW execution time from the SW execution time of the n-th executed basic function is calculated and added to S.

In step 314, it is determined whether S is not more than the predetermined target performance value. When it is determined that S is not more than the target performance value, the process proceeds to step 316. In step 316, the transmission information to transmit the circuit design information of the n-th basic function of the DMA transmission list through the DMA transmission is changed to the transmission information to transmit the source program of the n-th basic function through the DMA transmission. Specifically, the transmission origin address of the n-th transmission information is changed to the address that is indicated by the program address 86 of the n-th basic function management data, and the transmission size is changed to the size of the source program that is stored in the program address 86.

Next, in step 318, 1 is added to n and the process returns to step 310.

When it is determined that S is more than the target performance value in step 306, when it is determined that n is more than the basic function number in step 310, and when it is determined that S is more than the target performance value in step 314, the process proceeds to step 320.

In step 320, the transmission preparation completion notification is transmitted to the information processing apparatus 14. In step 322, the DMAC 23 starts, such that the information of the DMA transmission target is transmitted to the information processing apparatus 14 according to the DMA transmission list. The started DMAC 23 performs the DMA transmission according to the DMA transmission list.

The CPU 52 of the function executing unit 44 according to the secondary exemplary embodiment executes the function executing process according to the flowchart of FIG. 7. However, the process in step 110 is different from that of the first exemplary embodiment.

The processes of steps 100 to 108 are the same as those of the first exemplary embodiment. In step 110, the circuit design information and the source program that are received from the circuit design information generating equipment 12 are sequentially read from the storage unit 46 and the basic functions constituting the function X are sequentially executed. That is, when the data that is received from the circuit design information generating equipment 12 and stored is the circuit design information, the CPU 52 starts the reconfigurable controller 50 to reconfigure the circuit 57, and executes the basic function. When the data that is received from the circuit design information generating equipment 12 and stored is the source program, the CPU 52 executes the program obtained by converting the format of the source program into the executable format to perform the basic function.

Next, the process of step 110 will be described using a specific example. In the description below, the process of executing the basic function by the circuit 57 is called a hardware process, and the process of executing the basic function by executing the program of the executable format obtained by converting the format of the source program by the CPU 52 is called a software process.

For example, in regards to the function A illustrated in FIG. 5, when the source program of the basic function 1, the source program of the basic function 2, the circuit design information of the basic function 3, and the circuit design information of the basic function 4 are received from the circuit design information generating equipment 12, the function executing unit 44 executes the software process with respect to the basic function 1 and the basic function 2, and executes the hardware process with respect to the basic function 3 and the basic function 4.

In the case where the function B illustrated in FIG. 5 is requested after the function A, in regards to the function B, when the source program of the basic function 1, the source program of the basic function 2, the circuit design information of the basic function 3, and the circuit design information of the basic function 5 are received from the circuit design information generating equipment 12, the function executing unit 44 executes the software process with respect to the basic function 1 and the basic function 2, and executes the hardware process with respect to the basic function 3 and the basic function 5, similar to the case of the function A. When the function B is a function that does not use the process result of the function A and is independently executed, the CPU 52 executes the basic function 1 and the basic function 2 of the function B, while the basic function 3 and the basic function 4 are executed by the circuit 57.

Next, a usage efficiency of the software and the hardware will be described using FIGS. 12 and 13.

Figure 12:
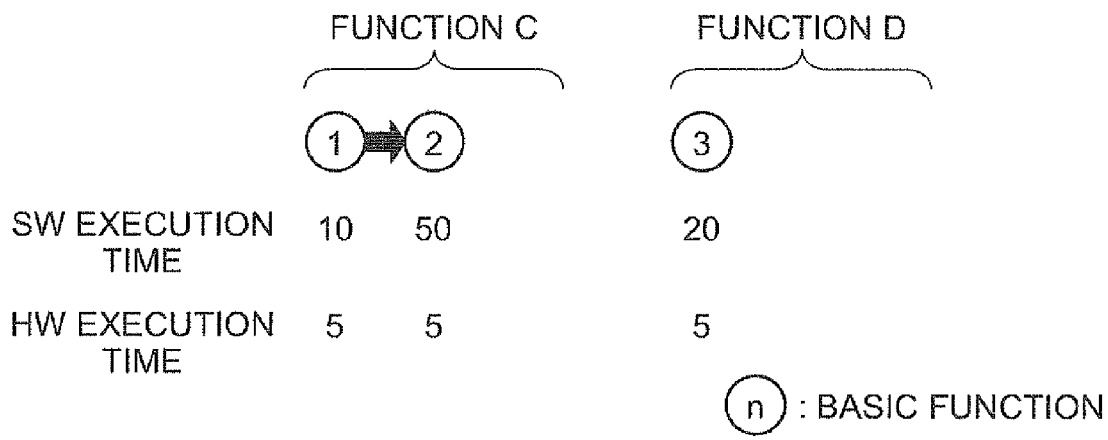
FIG. 12 is a diagram illustrating an example of each basic function constituting each of a function C and a function D and an SW execution time and an HW execution time for each basic function.

FIG. 12 illustrates an example of basic functions constituting each of a function C and a function D and an SW execution time and an HW execution time of each basic function. A figure that indicates each of the HW execution time and the SW execution time conceptually represents the time, and does not specifically define a minute or a second. The function C is a function that is realized by sequentially executing the basic function 1 and the basic function 2. The function D is a function that is realized by executing the basic function 3. In this case, the function C and the function D are the functions to be independently executed. That is, the function C and the function D are not in the relationship where one of the functions C and D is executed using the process result of the other.

As illustrated in FIG. 12, the SW execution time of the basic function 1 is 10 and the HW execution time thereof is 5. The SW execution time of the basic function 2 is 5 and the HW execution time thereof is 5. The SW execution time of the basic function 3 is 20 and the HW execution time thereof is 5. In this case, it is assumed that the target performance value of the function C is 15 and the target performance value of the function D is 10.

In regards to the function D, in order to meet the target performance value 10, the basic function 3 needs to be subjected to the hardware process. In regards to the function C, even when the basic function 1 and the basic function 2 are subjected to the hardware process or when the basic function 1 is subjected to the software process and the basic function 2 is subjected to the hardware process, the target performance value 15 is met.

In this case, two patterns of a pattern 1 and a pattern 2 are exemplified. In the pattern 1, the basic function of each of the functions C and D is subjected to the hardware process. In the pattern 2, the basic function 1 of the function C is subjected to the software process and the second function 2 is subjected to the hardware process, and the basic function 3 of the function D is subjected to the hardware process. In the pattern 1, the function D is in a waiting state until the function C ends. However, in the pattern 2, the function D is executed without being in the waiting state until the function C ends.

Figure 13:
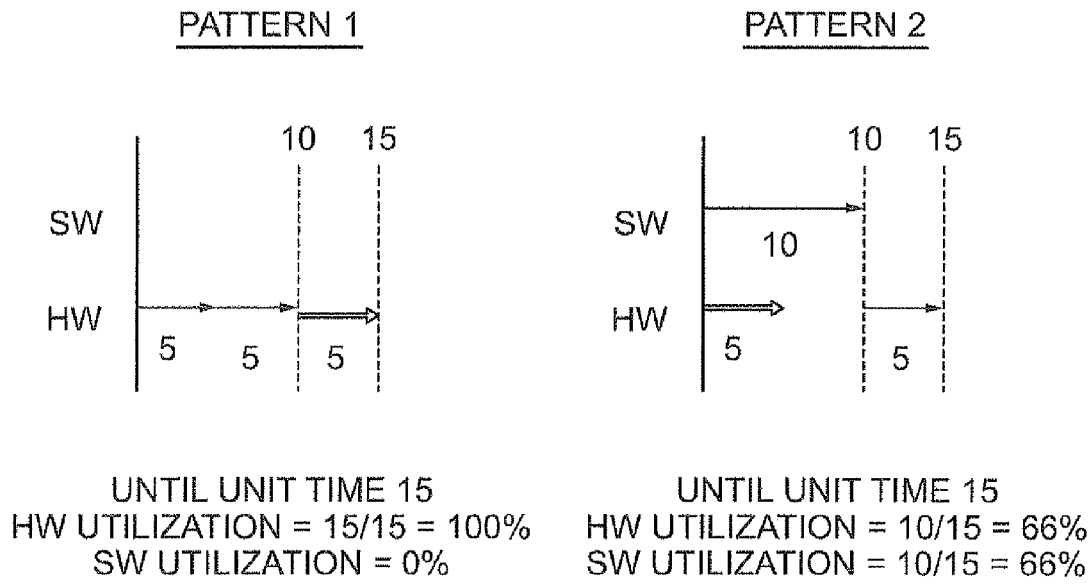
FIG. 13 is a diagram illustrating an example of hardware and software utilizations in each of a pattern 1 where each basic function of each of the function C and the function D is executed by a hardware process and a pattern 2 where a basic function 1 of the function C is executed by a software process, a basic function 2 is executed by a hardware process, and a basic function 3 of the function D is executed by the hardware process.

FIG. 13 illustrates hardware and software utilizations of each of the pattern 1 and the pattern 2. In this case, the hardware utilization means a ratio of the sum of HW execution times with respect to the total execution time of the function, and the software utilization means a ratio of the sum of SW execution times with respect to the total execution time of the function.

In the case of the pattern 1, the hardware utilization and the software utilization in the unit time 15 are as follows.

Hardware utilization=15/15=100%
Software utilization=0%

In the case of the pattern 2, the hardware utilization and the software utilization in the unit time 15 are as follows.

Hardware utilization=10/15=66%
Software utilization=10/15=66%

In the above case, the example of calculating the specific basic function where the software process is executed after the circuit design information is generated is described using FIG. 10. However, the specific basic function where the software process is executed before the circuit design information is generated may be calculated.

Figure 14:
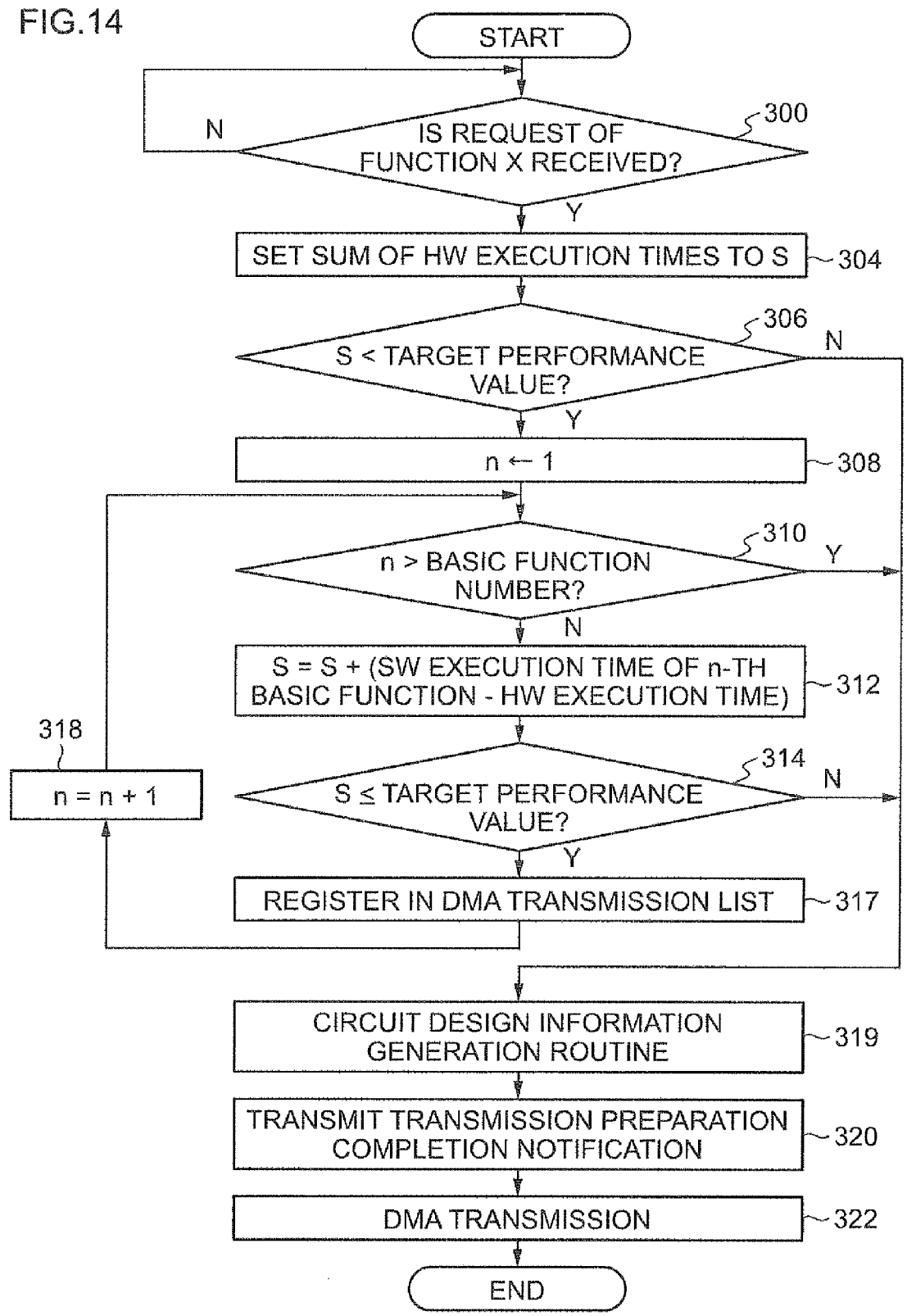
FIG. 14 is a flowchart illustrating another example of a generation control process that is executed by a CPU of the circuit design information generating equipment according to the second exemplary embodiment.

FIG. 14 is a flowchart illustrating another example of a generation control process that is executed by the CPU 20 of the circuit design information generating equipment 12 according to the second exemplary embodiment. In FIG. 14, the same steps as those of FIG. 10 are denoted by the same reference numerals, and only different steps are described herein.

When the determination result of step 300 is affirmative, the circuit design information generation routine is not executed, but the processes of steps 304 to 317 are executed. In step 317, the transmission information to transmit the source program of the n-th basic function through the DMA transmission is registered in the DMA transmission list.

When it is determined that S is more than the target performance value in step 306, when it is determined that n is more than the basic function number in step 310, and when it is determined that S is more than the target performance value in step 314, the process proceeds to step 319.

In step 319, the circuit design information generation routine is executed, and the circuit design information of each basic function is generated according to the necessity.

Figure 15:
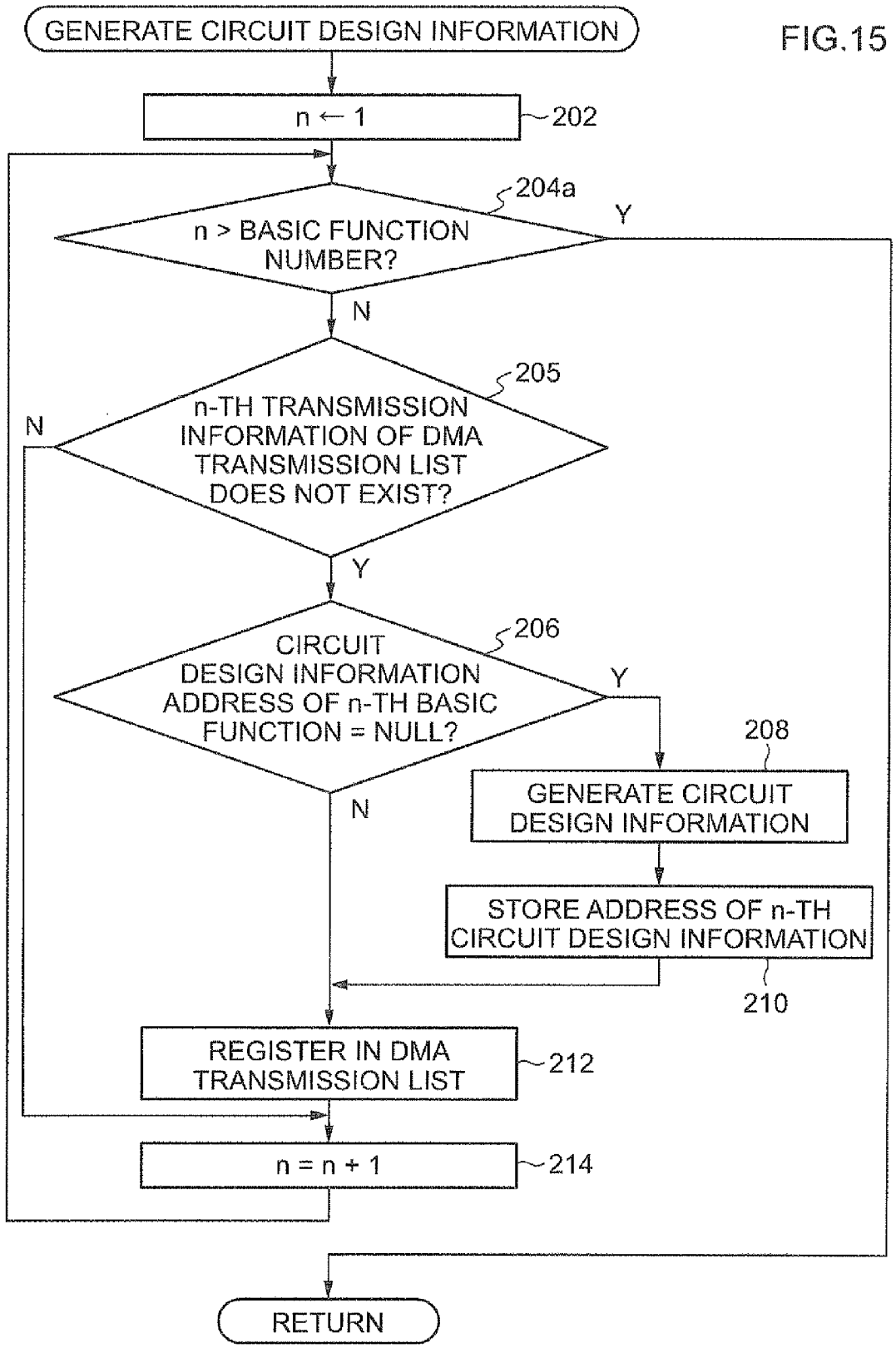
FIG. 15 is a flowchart illustrating a flow of a circuit design information generation routine executed in step 319 of FIG. 14.

FIG. 15 is a flowchart illustrating a flow of the circuit design information generation routine executed in step 319. In FIG. 15, the same steps as those of FIG. 11 are denoted by the same reference numerals, and only different steps are described herein.

When it is determined that n is not more than the basic function number in step 204a, the process of step 205 is executed before the process of step 206 is executed. In step 205, it is determined whether the nth transmission information exists in the DMA transmission list. When it is determined that the n-th transmission information exists in the DMA transmission list, this indicates that the n-th basic function is a basic function subjected to the software process and the transmission information to transmit the source program to the information processing apparatus 14 is already registered in the DMA transmission list. Accordingly, since the circuit design information does not need to be generated with respect to the basic function, the process proceeds to step 214 where 1 is added to n, and the process returns to step 204a. Meanwhile, when it is determined that the n-th transmission information does not exist, the circuit design information is needed, because the n-th basic function is the basic function subjected to the hardware process. Accordingly, the processes of steps after step 206 are executed.

In the above description, in FIGS. 10 and 14, it is determined whether the basic functions are subjected to the software process in the execution order of the basic functions, but the invention is not limited thereto. For example, it may be determined whether the basic functions are subjected to the software process in the reverse order of the execution order. The determination may be made in the order of the basic functions having the short or long SW execution times, and the hardware process may be changed to the software process in a range where S becomes the target performance value.

In the above description, an example that the process of each basic function changes from the hardware process to the software process in the range where the execution time of the requested function becomes the target performance value or less is described, but the invention is not limited thereto. For example, in the execution of the requested function, in a range where the amount of data processed per unit time becomes the predetermined target value or less, the process of each basic function may change from the hardware process to the software process. For example, in the basic function management data, the amount of data processed per unit time during the software process and the amount of data processed per unit time during the hardware process are registered for each basic function, and the target value of the amount of data processed per unit time is previously set as the target performance value. In step 304, an average value of the amount of data processed per unit time for each basic function is set to a variable S. In step 312, an average value of when the process of the basic function changes to the software process may be calculated, the average value may be compared with the target performance value in step 314, and the process of the basic function may change to the software process in the range where S becomes the target performance value or less.

In the second exemplary embodiment, the case where S is controlled to become the target performance value or less is exemplified, but the invention is not limited thereto. Instead of the target performance value, the performance target range (upper and lower limits) may be determined, and S may be controlled in the performance target range.

The basic function that is subjected to the software process and the basic function that is subjected to the hardware process may be determined based on each SW execution time. For example, a ratio (hereinafter, referred to as load ratio) of the SW execution time of each basic function with respect to the sum of the SW execution times may be calculated, and the determination may be made using the ratio. Alternatively, the determination may be made using the SW execution time as it is.

Figure 16:
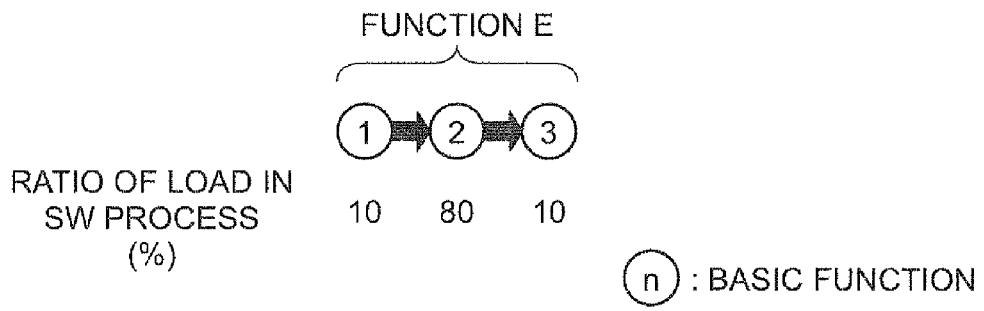
FIG. 16 is a diagram illustrating an example of a ratio of a load of each basic function when each basic function constituting a function E is subjected to a software process.

For example, as illustrated in FIG. 16, a function E is a function that is realized by sequentially executing the basic function 1, the basic function 2, and the basic function 3. In the case where the basic function 1 is 10%, the basic function 2 is 80%, and the basic function 3 is 10% as the load ratio of each basic function when each basic function is subjected to the software process, the circuit design information is generated, such that the hardware process is executed on the basic function 2 having the highest load ratio. The other basic functions 1 and 3 may be determined as the basic functions to be subjected to the software process, and the source program may be transmitted to the information processing apparatus 14 without generating the circuit design information.

Figure 17:
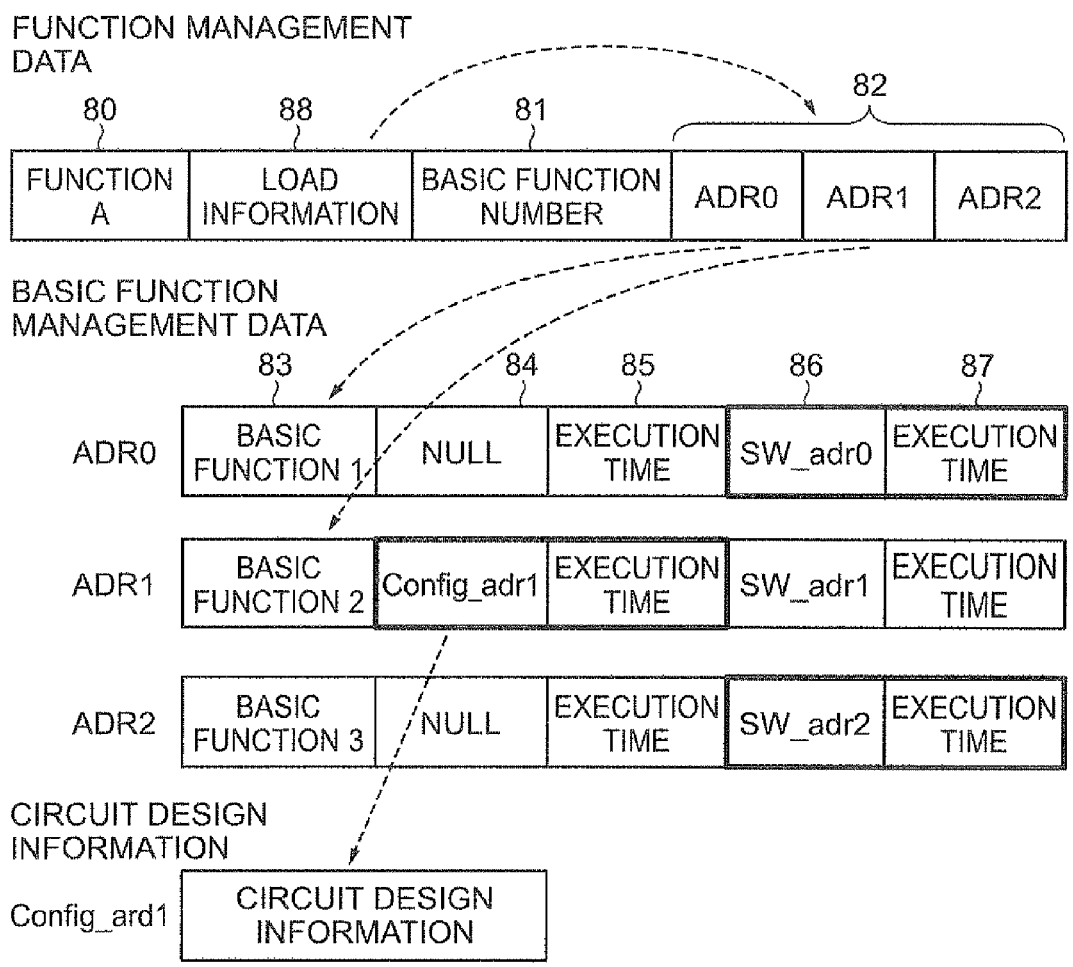
FIG. 17 is a diagram illustrating an example of basic function management data and function management data including information (load information) to specify a basic function having a highest load ratio among basic functions constituting functions.

As illustrated in FIG. 17, information 88 (hereinafter, referred to as a load information 88) that indicates a basic function having the highest load ratio may be stored to be included in the function management data in advance. In this example, the load information 88 indicating the basic function 2 is stored in the function management data. Thereby, the circuit design information is generated with respect to the basic function 2, but the circuit design information of the basic functions 1 and 3 that are subjected to the software process is not generated. Of course, when the circuit design information is already generated with respect to the basic function 2, the generated circuit design information may be used.

As illustrated in FIG. 17, the invention is not limited to the case where the basic function having the highest load ratio is previously designated as the basic function subjected to the hardware process and the generation of the circuit design information is controlled, but the basic function having the highest load ratio may be dynamically calculated from the SW execution time 87 of each basic function management data, the calculated basic function may be controlled to be subjected to the hardware process, and the other basic functions may be controlled to be subjected to the software process. The basic function where the load ratio is higher than the predetermined ratio or the basic function where the SW execution time is longer than the predetermined time may be controlled to be subjected to the hardware process, and the other basic functions may be controlled to be subjected to the software process.

The second exemplary embodiment is only exemplary, and the invention is not limited thereto. For example, the circuit design information generating equipment 12 may store the transmission history of the circuit design information and the source program, may transmit the circuit design information and the source program other than the transmitted circuit design information and source program to the information processing apparatus 14, based on the transmission history, and may not transmit the previously transmitted circuit design information and source program.

As such, when the circuit design information and the source program are transmitted from the circuit design information generating equipment 12 to the information processing apparatus 14 in unit of a basic function, not unit of a function, the circuit design information and the source program are stored and managed in the storage unit 46 of the information processing apparatus 14 for each basic function, and the same circuit design information and source program are not redundantly stored. In this case, the information indicating the basic functions constituting each function and the execution order needs to be held by the function executing unit 44. This information may be transmitted from the circuit design information generating equipment 12 to the information processing apparatus 14. The function executing unit 44 reconfigures the circuit design information based on the information indicating the basic functions constituting each function and the execution order that is held in the function executing unit 44 or received from the circuit design information generating equipment 12, or executes the program to perform the requested function.

The generation control in the circuit design information generating equipment 12 may be performed by the main controller 40. That is, the main controller 40 may have various data that is stored in the first storage unit 26 of the circuit design information generating equipment 12, execute the circuit design information generating program and the generation control processing program to supply the circuit design information and the source program of the requested function to the function executing unit 44.

Further, the CPU that converts the format of the source program into the executable format and executes the program is not limited to the CPU 52 provided in the function executing unit 44. For example, the CPU 70 of the main controller 40 may execute the program or a CPU may be provided separately from the CPU 52 and the CPU 70 and the program may be executed by the CPU.

In the second exemplary embodiment, the case where the source program for each basic function is transmitted to the information processing apparatus 14, and the CPU 52 of the function executing unit 44 converts the source program into the program of the executable format, executes the program, and executes the software process is exemplified. However, the circuit design information generating equipment 12 may convert the format of the source program into the executable format, and transmit the converted program from the circuit design information generating equipment 12 to the information processing apparatus 14. Instead of the configuration where the program is dynamically converted and transmitted, the program whose format is previously converted into the executable format may be stored in the circuit design information generating equipment 12, and the program of the executable format instead of the source program may be transmitted to the information processing apparatus 14.

Third Exemplary Embodiment

In the first and second exemplary embodiments, the cases where the function executing unit 44 executes the function requested from the main controller 40 are exemplified. However, in the third exemplary embodiment, the case where not only the function executing unit 44 but also the circuit design information generating equipment 12 is operated as the function executing apparatus to perform the requested function is exemplified.

Since the configuration of the circuit design information generating equipment 12 and the information processing apparatus 14 according to the third exemplary embodiment is the same as that of the first exemplary embodiment, the description thereof is omitted.

Figure 18:
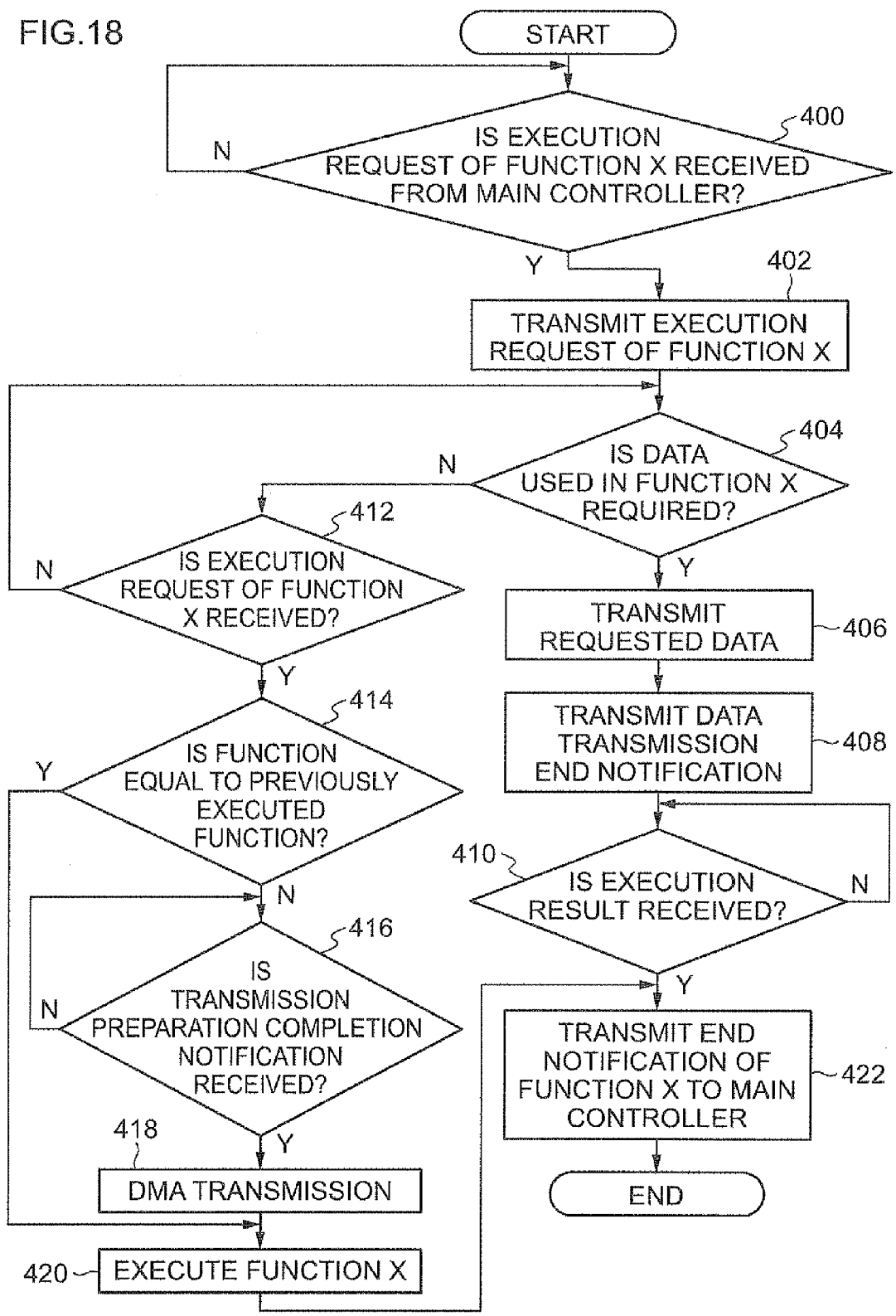
FIG. 18 is a flowchart illustrating a flow of a function executing process that is executed by a CPU of an image processing unit of the information processing apparatus according to the third exemplary embodiment.
Figure 19:
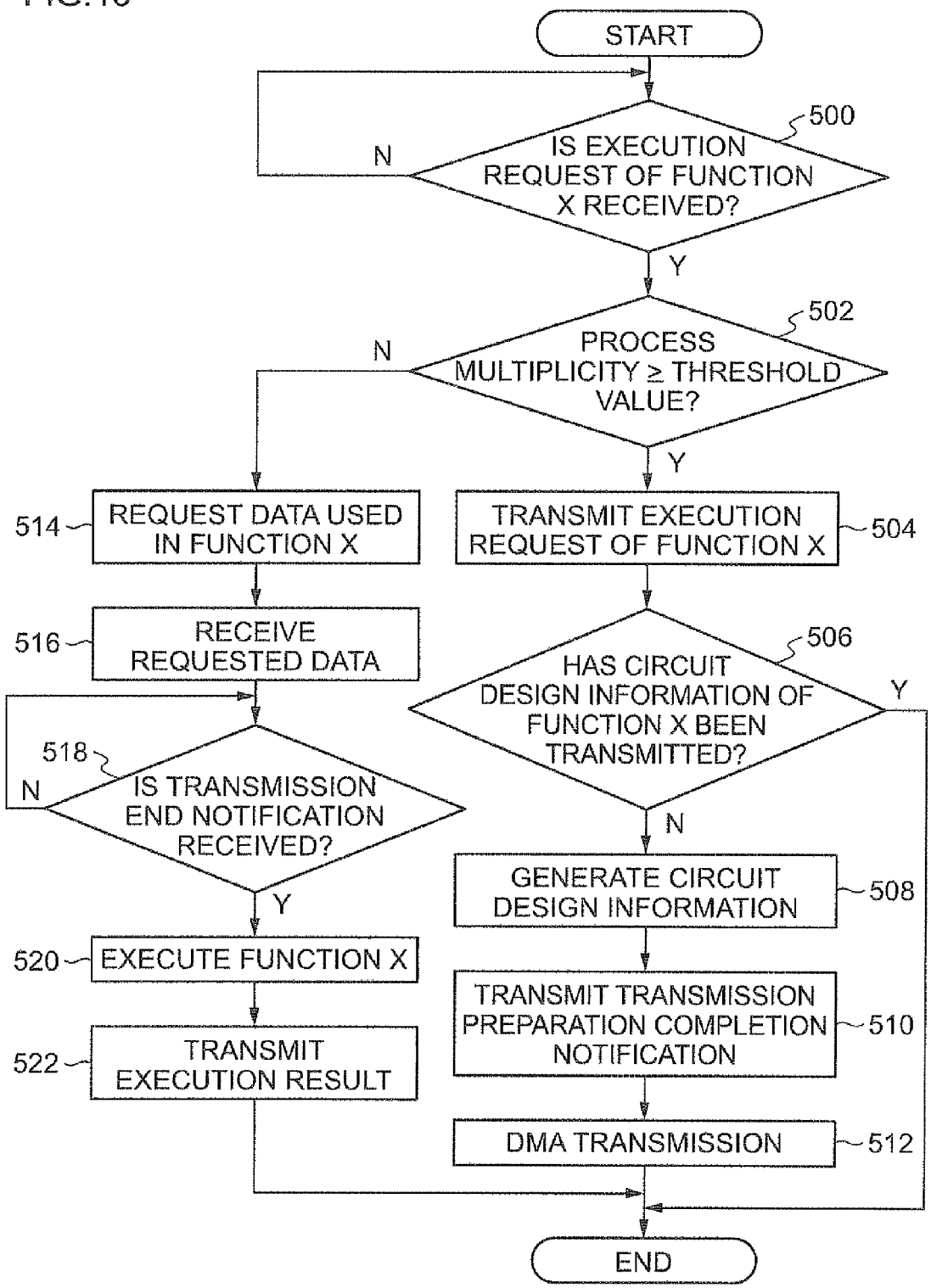
FIG. 19 is a flowchart illustrating a flow of a generation control process that is executed by a CPU of the circuit design information generating equipment according to the third exemplary embodiment.

FIG. 18 is a flowchart illustrating a flow of a function executing process that is executed by the CPU 52 of the function executing unit 44 of the information processing apparatus 14 according to the third exemplary embodiment. FIG. 19 is a flowchart illustrating a flow of a generation control process that is executed by the CPU 20 of the circuit design information generating equipment 12 according to the third exemplary embodiment.

First, the function executing process in the information processing apparatus 14 will be described. In step 400 of FIG. 18, the waiting state is maintained until the execution request of the function X is received from the main controller 40. When the execution request of the function X is received from the main controller 40, the process proceeds to step 402.

In step 402, an execution request of the function X is transmitted to the circuit design information generating equipment 12.

In step 404, it is determined whether a request of data (for example, image data that is stored in the image data memory area 63) used in the function X is given from the circuit design information generating equipment 12. When the determination result of step 404 is negative, in step 412, it is determined whether the execution request of the function X is received from the circuit design information generating equipment 12. In step 412, when it is determined that the execution request of the function X is not received from the circuit design information generating equipment 12, the process returns to step 404.

In step 404, when it is determined that the request of the data used in the function X is given, the requested data is transmitted to the circuit design information generating equipment 12 in step 406. When all of the requested data is transmitted, a data transmission end notification is transmitted to the circuit design information generating equipment 12 in step 408.

In step 410, the waiting state is maintained until the execution result of the function X is received from the circuit design information generating equipment 12. In step 410, when the execution result of the function X is received from the circuit design information generating equipment 12, an end notification indicating that the execution of the function X ends is transmitted to the main controller 40 in step 422.

Meanwhile, when the determination result of step 404 is negative and the determination result of step 412 is affirmative, it is determined whether the function X is the same as the previously executed function in step 414. When it is determined that the function X is not the previously executed function, the process proceeds to step 416. In step 416, the waiting state is maintained until the transmission preparation completion notification is received from the circuit design information generating equipment 12. When the transmission preparation completion notification is received from the circuit design information generating equipment 12, the DMAC 51 starts in step 418. The started DMAC 51 transmits the circuit design information, which is received from the circuit design information generating equipment 12, to the storage unit 46 through the communication I/F 55, and stores the circuit design information in the storage unit 46.

Similar to step 110 described in the first exemplary embodiment, in step 420, the circuit 57 is reconfigurable using the received circuit design information and the function X is executed. In step 422, the notification indicating that the execution of the function X ends is transmitted to the main controller 40.

Meanwhile, in step 412, when it is determined that the function X is the previously executed function, that is, when the circuit design information to realize the function X is already stored in the received information memory area 62 of the storage unit 46, the circuit 57 is reconfigurable using the stored circuit design information and the function X is executed in step 420.

Next, a generation control process in the circuit design information generating equipment 12 will be described. In step 500 of FIG. 19, the waiting state is maintained until the execution request of the function X is received from the information processing apparatus 14. In step 500, when the execution request of the function X is received from the circuit design information generating equipment 12, it is determined whether process multiplicity is more than a predetermined threshold value in step 502. In this case, the process multiplicity indicates the number of functions in execution by the circuit design information generating equipment 12 and functions in the execution waiting state. The process multiplicity is one of the information to indicate a load of the circuit design information generating equipment 12.

In step 502, when it is determined that the process multiplicity is more than the threshold value, the execution request of the function X is transmitted to the information processing apparatus 14 in step 512.

In step 506, it is determined whether the circuit design information of the function X is previously transmitted to the information processing apparatus 14. For example, the circuit design information generating equipment 12 may store the transmission history of the circuit design information for each function in the first storage unit 26 or the second storage unit 27, and perform the determination based on the transmission history. The information indicating whether or not the function X is the same as the function previously executed by the information processing apparatus 14 may be received from the information processing apparatus 14. In step 506, when it is determined that the circuit design information of the function X is not yet transmitted, the circuit design information is generated in step 508. Since the process routine of the generation of the circuit design information in step 508 is the same as the process routine illustrated in FIG. 11, the description thereof is omitted.

In step 510, the transmission preparation completion notification is transmitted to the information processing apparatus 14. In step 512, the DMAC 23 starts, such that the information (circuit design information, in this case) of the DMA transmission target is transmitted to the information processing apparatus 14 according to the DMA transmission list. The started DMAC 23 transmits the circuit design information to the information processing apparatus 14 according to the DMA transmission list.

In step 506, when it is determined that the circuit design information of the function X is previously transmitted to the information processing apparatus 14, the processes of steps 508 to 512 are not executed and the process routine ends.

Meanwhile, in step 502, when it is determined that the process multiplicity is less than the threshold value, data (for example, image data of the image process target) used in the function X is requested with respect to the information processing apparatus 14 in step 514. In step 516, the requested data is received from the information processing apparatus 14. In step 518, it is determined whether the transmission end notification of the requested data is received from the information processing apparatus 14. When the determined result of step 518 is affirmative, the formats of the source programs of the individual basic functions constituting the function X are sequentially converted into the executable format, the source programs are executed, and the function X is executed in step 520.

In step 522, the execution result of the function X is transmitted to the information processing apparatus 14.

In the third exemplary embodiment, the process multiplicity is used as the information indicating the load of the circuit design information generating equipment 12, but the invention is not limited thereto. For example, the current CPU utilization of the circuit design information generating equipment 12 may be used.

In the third exemplary embodiment, the circuit design information generating method according to the second exemplary embodiment may be applied. For example, when the function X is executed by the function executing unit 44 of the information processing apparatus 14, as described in the second exemplary embodiment, the specific basic function that is subjected to the software process may be calculated under the predetermined condition, the source program instead of the circuit design information may be transmitted with respect to the specific basic function, and the circuit design information may be generated and transmitted with respect to the basic functions other than the specific basic function.

In the third exemplary embodiment, the case where the circuit design information generating equipment 12 is operated as the function executing apparatus to execute the requested function is exemplified, but the invention is not limited thereto. For example, a function executing apparatus that includes a computer having a CPU and may execute the software process of the basic functions is provided on the network 16 separately from the circuit design information generating equipment 12 and the information processing apparatus 14 (not illustrated), and the function executing apparatus may be controlled to execute the requested function in place of the circuit design information generating equipment 12, when the value indicating the load of the function executing apparatus is less than the predetermined value. That is, the circuit design information generating equipment 12 acquires the value indicating the load of the function executing apparatus from the function executing apparatus, determines whether the value is less than the threshold value, and transmits the source programs of the basic functions constituting the function to the function executing apparatus, and the function executing apparatus executes the source programs.

The functions of which the execution is requested are not limited to the functions of the image processing. The functions may be applied to various functions that are executed by the circuit design information reconfigurable based on the circuit design information.

In the first to third exemplary embodiments, the case where the circuit design information is requested to the circuit design information generating equipment 12 by the CPU 52 of the function executing unit 44 is exemplified, but the invention is not limited thereto. For example, the circuit design information may be requested to the circuit design information generating equipment 12 by the CPU 70 of the main controller 40.

In the first to third exemplary embodiments, the case where one information processing apparatus 14 is connected to the network 16 is exemplified. However, the plural information processing apparatuses 14 may be connected to the network 16. In this case, the circuit design information generating equipment 12 receives the requests of the circuit design information of the functions from the plural information processing apparatuses 14 and transmits the circuit design information (generates the circuit design information and transmits the circuit design information, if necessary) with respect to each of the received requests.

What is claimed is:

1. A circuit design information generating equipment, comprising:
    a first memory area that stores a source program which corresponds to at least one basic function of a plurality of functions;
    a second memory area that associates circuit design information used to reconfigure a circuit with the basic function and stores circuit design information; and
    a control component that,
        when the basic function constitutes a requested function, and the circuit design information that corresponds to the basic function is stored in the second memory area,
            reconfigures the circuit using the stored circuit design information, and
        when the circuit design information that corresponds to the basic function is not stored in the second memory area,
            generates circuit design information corresponding to the basic function using the source program corresponding to the basic function stored in the first memory area,
            stores the generated circuit design information in the second memory area,
            reconfigures the circuit configured to execute the requested function using the generated circuit design information, and
            executes the requested function with the reconfigurable circuit.

2. A function execution system, comprising:
    the circuit design information generating equipment of claim 1; and
    a function executing apparatus that includes the circuit, which is reconfigurable using the circuit design information, and that executes the requested function.

3. The function execution system of claim 2 further comprising:
    a second function executing apparatus that comprises a computer configured to execute a program obtained by converting the source program into an executable format, wherein
    the control component controls such that the requested function is not executed by the function executing apparatus, and the requested function is instead executed by the second function executing apparatus using the program obtained by converting the source program stored in the first memory area into the executable format, when information indicating a state of a load of the second function executing apparatus is acquired in the circuit design information generating equipment and the acquired information indicating the state of the load meets a predetermined condition.

4. A circuit design information generating equipment, comprising:
    a first memory area that stores a source program which corresponds to at least one basic function of a plurality of functions;
    a second memory area that associates circuit design information used to reconfigure a circuit with the basic function and stores circuit design information; and
    a control component that executes a requested function by a first control and a second control, such that,
        when the basic function constitutes a requested function, and is set as a specified basic function to be executed using a program obtained by converting the source program stored in the first memory area to an executable format according to a predetermined condition related to execution of the requested function, the first control is performed so as to execute the specified basic function using the program obtained by converting the source program into the executable format,
        when the basic function is not set as the specified basic function and the corresponding circuit design information is stored in the second memory area, the second control is performed so as to execute a function which is not the specified function using the stored circuit design information, and
        when the basic function is not set as the specified basic function and the corresponding circuit design information is not stored in the second memory area, the second control is performed so as to
            generate circuit design information corresponding to the basic function using the source program which is stored in the first memory area and which corresponds to the basic function,
            store the generated circuit design information in the second memory area,
            reconfigure a circuit configured to execute the basic function using the generated circuit design information, and
            execute a function which is not the specified function using the reconfigurable circuit.

5. A function execution system, comprising:
    the circuit design information generating equipment of claim 4; and
    a function executing apparatus that includes the circuit, which is reconfigurable using the circuit design information, and a computer configured to execute the program obtained by converting the source program into the executable format, and executes the requested function using the circuit.

6. The function execution system of claim 5 further comprising:
   a second function executing apparatus that comprises a computer configured to execute the program obtained by converting the source program into the executable format, wherein
   the control component controls such that the requested function is not executed by the function executing apparatus, and the requested function is instead executed by the second function executing apparatus using the program obtained by converting the source program stored in the first memory area into the executable format, when information indicating a state of a load of the second function executing apparatus is acquired in the circuit design information generating equipment and the acquired information indicating the state of the load meets a predetermined condition.

7. A non-transitory computer-readable medium storing a program, which when executed by a computer that is connected to a first memory area that stores a source program corresponding to at least one basic function of a plurality of functions and a second memory area that associates circuit design information used to reconfigure a circuit with the basic function and stores the circuit design information, causes the computer to perform a process comprising:
   when the basic function constitutes a requested function, and circuit design information that corresponds to the basic function is stored in the second memory area,
      reconfiguring the circuit using the stored circuit design information; and
   when the circuit design information that corresponds to the basic function is not stored in the second memory area,
      generating circuit design information corresponding to the basic function using the source program corresponding to the basic function stored in the first memory area,
      storing the generated circuit design information in the second memory area,
      reconfiguring a circuit configured to execute the requested function, using the generated circuit design information stored in the second memory area, and
      executing the requested function with the reconfigurable circuit.

8. A non-transitory computer-readable medium storing a program, which when executed by a computer that is connected to a first memory area that stores a source program corresponding to at least one basic function of a plurality of basic functions and a second memory area that associates circuit design information used to reconfigure a circuit with the basic function and stores the circuit design information, causes the computer to perform a process comprising:
   when the basic function constitutes a requested function, and is set as a specified basic function to be executed using a program obtained by converting the source program stored in the first memory area to an executable format according to a predetermined condition related to execution of the requested function,
      executing the specified basic function using the program obtained by converting the source program into the executable format:
   when the basic function is not set as the specified basic function and the corresponding circuit design information is stored in the second memory area,
      reconfiguring the circuit using the stored circuit design information; and
   when the basic function is not set as the specified basic function and the corresponding circuit design information is not stored in the second memory area,
      generating circuit design information using the source program which is stored in the first memory area and which corresponds to the basic function,
      storing the generated circuit design information in the second memory area,
      reconfiguring a circuit configured to execute the basic function using the generated circuit design information, and
      executing a function which is not the specified function using the reconfigurable circuit.

* * * * *